(12) United States Patent
Saed

(10) Patent No.: US 8,964,925 B1
(45) Date of Patent: Feb. 24, 2015

(54) MULTI-RATE CONTROL LOOP FOR A DIGITAL PHASE LOCKED LOOP

(71) Applicant: PMC-Sierra US, Inc., Sunnyvale, CA (US)

(72) Inventor: Aryan Saed, Port Coquitlam (CA)

(73) Assignee: PMC-Sierra US, Inc., Sunnyvale, CA (US)

(*) Notice: Subject to any disclaimer, the term of this patent is extended or adjusted under 35 U.S.C. 154(b) by 44 days.

(21) Appl. No.: 13/827,587

(22) Filed: Mar. 14, 2013

(51) Int. Cl.
*H04L 7/00* (2006.01)
*H03L 7/08* (2006.01)

(52) U.S. Cl.
CPC .................................. *H03L 7/0802* (2013.01)
USPC ........... 375/373; 375/294; 375/327; 375/371; 375/375; 375/376

(58) Field of Classification Search
CPC ............ H04B 7/0848; H04L 2027/003; H04L 2027/0057; H04L 27/066; H04L 7/0029; H04L 7/005; H04L 25/03057; H03L 7/085; H03L 7/091; H03L 7/093; H03L 2207/50; H03L 7/08; H03L 7/0805; H03L 7/0807; H03L 7/0814; H03L 7/0816; H03L 7/0993; H03L 7/107; H03L 7/1075; H03L 7/1077
USPC ......... 375/227, 271, 294, 295, 316, 327, 342, 375/350, 369, 371, 373, 375, 376
See application file for complete search history.

(56) References Cited

U.S. PATENT DOCUMENTS

| | | | | |
|---|---|---|---|---|
| 5,966,258 | A * | 10/1999 | Bliss | 360/46 |
| 6,295,325 | B1 * | 9/2001 | Farrow et al. | 375/327 |
| 6,937,677 | B2 * | 8/2005 | Strolle et al. | 375/347 |
| 7,109,763 | B1 * | 9/2006 | Moyal et al. | 327/156 |
| 7,424,503 | B2 | 9/2008 | Moore et al. | |
| 7,830,986 | B1 * | 11/2010 | Gaither | 375/326 |
| 7,839,178 | B2 | 11/2010 | Chauhan | |
| 7,884,674 | B2 * | 2/2011 | Chen et al. | 331/1 A |
| 7,933,322 | B2 * | 4/2011 | Jin et al. | 375/226 |
| 7,965,143 | B2 | 6/2011 | Kawamura | |
| 7,986,190 | B1 * | 7/2011 | Lye | 331/1 A |
| 8,670,512 | B1 * | 3/2014 | Wang | 375/371 |
| 8,718,217 | B2 * | 5/2014 | Walker et al. | 375/376 |
| 2002/0141515 | A1 * | 10/2002 | Enam et al. | 375/340 |
| 2007/0133667 | A1 * | 6/2007 | Jin et al. | 375/226 |
| 2008/0037594 | A1 * | 2/2008 | Hornbuckle et al. | 370/537 |
| 2012/0213306 | A1 * | 8/2012 | Huang et al. | 375/285 |

* cited by examiner

*Primary Examiner* — Hirdepal Singh
(74) *Attorney, Agent, or Firm* — Dennis R. Haszko

(57) ABSTRACT

Methods and systems to generate control signals for timing recovery of a signal received over baseband communications systems are disclosed. The timing control circuit uses a multi-rate DSP structure for the implementation of the DSP functions in the control loop for use in an ASIC and requires a reduced DSP clock rate, which in turn reduces the need for pipelining and/or high-speed libraries. Thus lower latency, better tracking performance and lower power consumption are achieved. An example embodiment involves splitting the timing error signal, supplied at a given update rate, into a sum and a difference component, and processing each component in separate circuit chains at half the update rate. The resultant half-rate control signals from each separate circuit chain are joined to provide a control signal at the full update rate. Thus, implementations of the present disclosure perform like a full-rate structure, but require a halved DSP clock rate.

40 Claims, 14 Drawing Sheets

MULTI-RATE CONTROL LOOP FOR A DIGITAL PHASE LOCKED LOOP

FIELD

The present disclosure relates to signal processing in data networking and communications applications, and more specifically to serializer/deserializer (SERDES) devices for electrical lines used in data communications at any line rate.

BACKGROUND

Baseband communications systems involve the transmission of bits over an electrical or optical line. The transmitter sends the data bits in one of several formats, such as PAM (Pulse Amplitude Modulation) or NRZ (Non-Return to Zero) modulation. Modern systems carry data bits of multiple Gigabit rates over electrical wire, back planes, board traces and/or over optical fibers. Examples are SAS and SATA disk data transfer protocols operating at 1.5 Gbps, 3 Gbps, 6 Gbps and 12 Gbps.

When the data bits are carried over the electrical or optical media, the signal is impaired by several effects. These include, among others: power supply noise; cross talk; frequency dependence of the channel transfer function; DC offset; and clock jitter, clock frequency, and phase offsets at the transmitter and receiver. It is the task of the receiver to recover the transmitted bits from the impaired received signal.

In receivers of SERDES systems, the high-speed line signal is sampled serially and the recovered bits are output in groups, in parallel, at a lower rate. For instance a SERDES for a 6 Gbps line rate might sample the line rate at 6 Gbps and output the recovered data to a 10-bit bus at 600 MHz or a 20-bit bus at 300 MHz.

In most analog SERDES receivers, the local bit recovery clock is carefully and precisely synchronized with the baud rate of the received signal. Then, at each receiver clock cycle, the signal is sampled at the center of the baud to recover the transmitted bit. Additional equalization may be applied to undo some of the channel distortion and to improve the BER (Bit Error Rate).

In most DSP (Digital Signal Processing) based asynchronous SERDES receivers, the local bit recovery clock is not synchronized, and instead the received analog signal is first sampled and digitized at the ADC (Analog to Digital Converter) using the DSP clock. A DSP interpolator is applied to recover the data bits, and its interpolation index is calculated by a DSP based TR (Timing Recovery) circuit. To this end, the received signal is sampled at a rate higher than the baud rate. The over sampling rate may be 1.5×, 2×, 3× or even 4× depending on the desired interpolation and timing tracking performance at the given signal impairments. Typically the asynchronous DSP clock frequency may be several hundreds or even thousands of ppm (parts per million) offset from the transmit clock.

To perform the data recovery, the TR circuit supplies a regularly updated interpolation index to the interpolator, which calculates the signal amplitude at that index. This calculated signal amplitude is then used to recover the transmitted data bit. Often this simply involves determining the sign of the interpolated signal at the desired interpolation index. In some systems an equalizer may be applied, which calculates an equalized amplitude from the interpolated amplitude. The equalizer may comprise a FFE (Feed Forward Equalizer) and/or a DFE (Decision Feedback Equalizer).

When the final SERDES system is validated, it is assessed in terms of its tolerance to SJ (Sinusoidal jitter) under various operating conditions. This is a characterization based on the BER (Bit Error Rate) of the received signal.

Digital timing control circuits in communications systems, such as a DPLL (Digital Phase Locked Loop), involve the calculation of a phase and/or frequency control signal in response to a timing error obtained from the received signal. In feedback control systems, the error is obtained from the signal after the phase and/or frequency adjustment has been applied. The feedback delay is typically defined as the time taken to calculate the timing error signal, to update the control signal based on the calculated timing error signal, and to apply the updated control signal to the incoming signal.

The delay is primarily due to pipelining stages in the digital control circuits, and is critical in the performance of the timing recovery. The digital control circuit involves the use of DSPs to calculate the control signal based on the detected error signal. The DSP functions in an ASIC implementation involve arithmetic circuits such as signal multipliers, signal comparators, and signal adders, which are synthesized into logic gates.

At high data rates, a high rate DSP clock must be applied for satisfactory loop tracking performance. The logic for the arithmetic circuits must be synthesized with a high speed library of gates and/or by applying pipelining stages.

For instance, in a DSP system, to recover data at a rate of 6 Gbps in an application such as SAS or SATA, it is necessary to perform loop tracking at DSP rates above 700 Msps. In other words, the DSP logic gates must be clocked at rates above 700 MHz. Consequently, the DSP arithmetic must be pipelined and fast library cell sets with Low VTs (Low Threshold Voltage) must be used in conjunction with logic gate libraries with channel sizes of 40 nm and 65 nm. The additional pipeline registers increase the power consumption per clock cycle, and the Low VT library cells draw increased static power. However, state of the art ASIC implementations for high speed data communication systems are specified with very tight power consumption and heat dissipation limits.

Thus, it is desirable to design high speed control circuits that draw less power and have lower latency. Also, improvements in the generation of control signals for timing recovery of the received signal are desirable.

BRIEF DESCRIPTION OF THE DRAWINGS

Embodiments of the present disclosure will now be described, by way of example only, with reference to the attached Figures.

DETAILED DESCRIPTION

Figure 1:
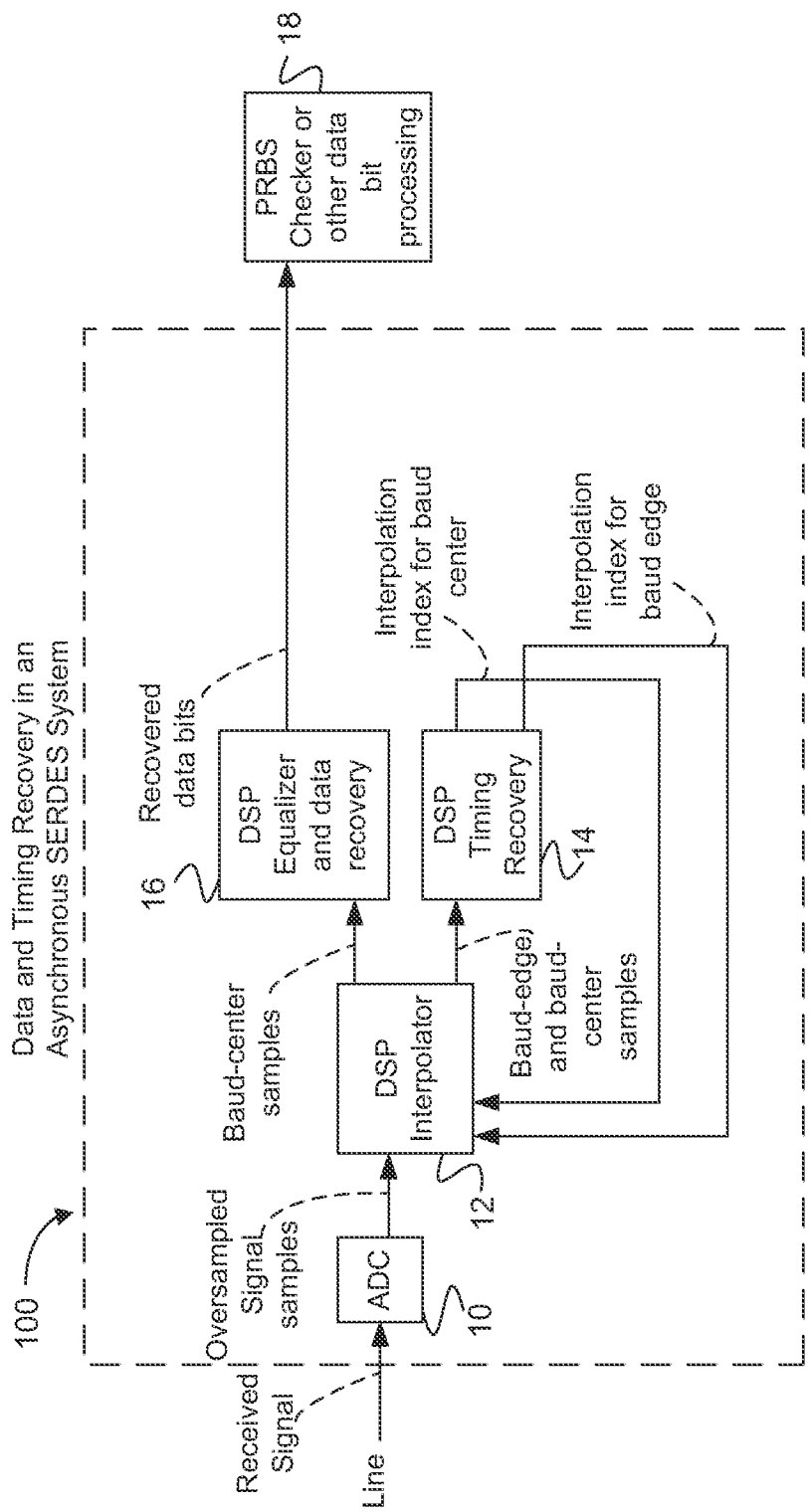
FIG. 1 illustrates a known approach (asynchronous) to data and timing recovery in a SERDES system.

Advancement in data communications requires transmissions at ever increasing data rates over ever more challenging communications channels. Evidence of this is the deployment of equipment supporting several standardized protocols.

An example of this is SATA (Serial Advanced Technology Attachment), with data rates up to 6 Gbps, with release 3.0 since May 2009, aimed at improving quality of service for video streaming in computers and notebooks. A further example is SAS (Serial Attached SCSI), with rates up to 6 Gbps for server backplanes. Other examples include communications systems for PON (Passive Optical Networks), which carry data over optical and electrical channels, as well as FibreChannel, InfiniBand, and USB.

With increasing data rates, the electrical and optical distortions as well as other sources of signal impairments become more challenging to overcome. To this end, data and clock recovery circuits use increasingly sophisticated receiver schemes, which include analog and digital equalization, digital timing recovery, and asynchronous systems. At these increased rates, the most common implementation is an ASIC (Application Specific Integrated Circuit).

In many applications, the SERDES power consumption and ASIC die area are critical, and it is desirable to add DSP arithmetic complexity in order to achieve a net reduction in power consumption and gate count.

It is also desirable to relax the digital logic timing constraints in order to reduce the work complexity during the layout stages of the design. Designs that are easy to close on timing require shorter development schedules and have lower risks.

Generally, the present disclosure pertains to the generation of control signals for timing recovery of a signal received over baseband communications systems. As described earlier, digital timing control circuits such as DPLL communications systems, involve the calculation of a phase and/or frequency control signal in response to a timing error obtained from the received signal. In the present disclosure, the timing control circuit uses a multi-rate DSP structure for the implementation of the DSP functions in the control loop for use in an ASIC. The implementation as disclosed herein requires a reduced DSP clock rate, which in turn reduces the need for pipelining and/or high-speed libraries. Consequently, these reductions yield lower latency, better tracking performance and lower power consumption. The multi-rate implementation, in an aspect of the present disclosure, involves splitting the timing error signal, supplied at a given update rate, into a sum and a difference component, and processing each component in separate circuit chains at half the update rate. The resultant half-rate control signals from each separate circuit chain are then joined to provide a control signal at the original full update rate. Thus, implementations of the present disclosure perform like a full-rate structure, but require a halved DSP clock rate.

Before discussing details of example embodiments of the present disclosure, certain known references will be contrasted with the example embodiments described herein.

Most known approaches involving multi-rate processing pertain to field of signal analysis and audio filtering, but not for high-speed DPLL design. As such, multi-rate filter design in audio filtering is not to be confused with filter designs or communication system designs to process signals at a variety of sampling rates or for a range of data rates as described herein.

Perfect Reconstruction (PR) filter banks are normally considered in the context of systems for audio compression, and they are normally critically sampled in both time and frequency. Other uses of PR filters include time-frequency decompositions for sound, and corresponding applications in music and digital audio effects. The so-called poly-phase representation for filter banks is both an important analysis tool and is a basis for efficient implementation in audio compression.

The simplest transform for PR filtering is the Haar transform, also called the "sum/difference" filters, as it applies a sum to a pair of input samples and a difference to a pair of input samples.

In contrast, the example implementations of the present disclosure apply a sum to a pair of samples, but do not apply a difference to the input, but rather a difference to the sum and one input.

Moreover, the present disclosure is not concerned with the decomposition of a lengthy filter into constituent low rate parts, as in multi-rate audio processing, but rather with the expansion of an accumulator in order to achieve accumulation at reduced clock rate, for example, half the clock rate.

The implementations of the present disclosure uses an elegant arithmetic solution for an accumulation function, and process pairs of signal samples in two parallel branches of a timing recovery circuit. The cost of duplication of some of the arithmetic components is generally offset by the benefits of applying a lower speed clock to the DSP circuits.

Typically, digital phase detectors in PLL design, for example, as described in U.S. Pat. No. 7,965,143, may be readily implemented in gate array or an FPGA to accurately quantize a phase difference between two clocks. However, these phase detectors are not concerned with the control of a clock phase or interpolation phase as described in the implementations of the present disclosure.

Other approaches are known for cascading stages of an accumulator. For example, U.S. Pat. No. 7,884,674 describes a phase detector, a pre-accumulator, a register, an accumulator and a digital controlled oscillator. The detector produces a first phase difference signal and a second phase difference signal.

In contrast, the implementations of the present disclosure do not have a pre-accumulator and an accumulator, but rather utilize a summing term. While accumulation involves summing, a sum of two values as in the present disclosure is not the same as a running accumulation with two inputs as described in U.S. Pat. No. 7,884,674. Moreover, the present disclosure is concerned with lowering the digital clock rate, and not with cascading stages of accumulation.

Still other known approaches provide for rapidly determining a phase difference between an output signal and a reference signal. For example, U.S. Pat. No. 7,839,178 provides a high speed digital phase/frequency comparator for PLLs. While the comparator uses accumulators, the '178 patent is not, unlike the present disclosure, concerned with the design of the accumulator.

Yet other known approaches provide for pipelined accumulators. For example, U.S. Pat. No. 7,424,503 describes a pipelined accumulator that provides pipelining across a bit slice by splitting a word into MSBs and LSBs. In contrast, the implementations of the present disclosure attempt to eliminate pipelining and do not split the accumulator input into word-parts.

FIG. 1 illustrates a known approach to data and timing recovery in a SERDES system 100, with an external jitter evaluation device (not shown). The signal from the line is sampled by an ADC 10 and then processed by an interpolator 12, or DSP interpolator, to obtain samples at the baud center and at the baud edge.

A DSP timing recovery 14 calculates and updates interpolation indices for the interpolator 12. An optional equalizer (for example, a DSP equalizer and data recovery unit 16) is applied before deciding on the value of the data bit at the baud center. A typical digital timing recovery circuit such as the Gardner timing recovery requires two samples per baud, one around the baud center and one around the baud edge. During tests, an optional pseudo random bit sequence (PRBS) checker 18, or other data bit processing, receives the recovered data bits from the DSP equalizer and data recovery unit 16 to check the recovered data bits for errors.

As is well known in the art, the interpolator 12 is supplied with an interpolation index which signifies which intermediate points of its input waveform are to be calculated, given typically only 2, 3 or 4 points per baud. Such an interpolator 12 typically supports a granularity of 10 to 16 positions per baud. The interpolator 12 may be based on a combination of low pass filter interpolation and linear or higher-order interpolation. For the Gardner timing recovery, two amplitudes are calculated. They can be jointly calculated for two completely independent interpolation indices, or one independent index may signify the baud center while the baud edge is calculated using the independent index for the baud center with a half-baud offset applied to it.

In block based SERDES systems, a burst of samples from the ADC 10 are provided in parallel. For instance, a system for a line rate of 6 Gbps may operate at 8 bits per block and a DSP clock of 750 MHz. Thus, the interpolator 12 computes 8 distinct amplitude values for the 8 baud centers and 8 distinct edge values for the baud edges. Additional control and calculations ensure continuity from block to block. The block of data is then processed by the timing recovery 14 to calculate an updated interpolation index for a next block. The timing error is based on the samples across the block. The loop filter, phase accumulator and add/drop is updated once per block.

Figure 2:
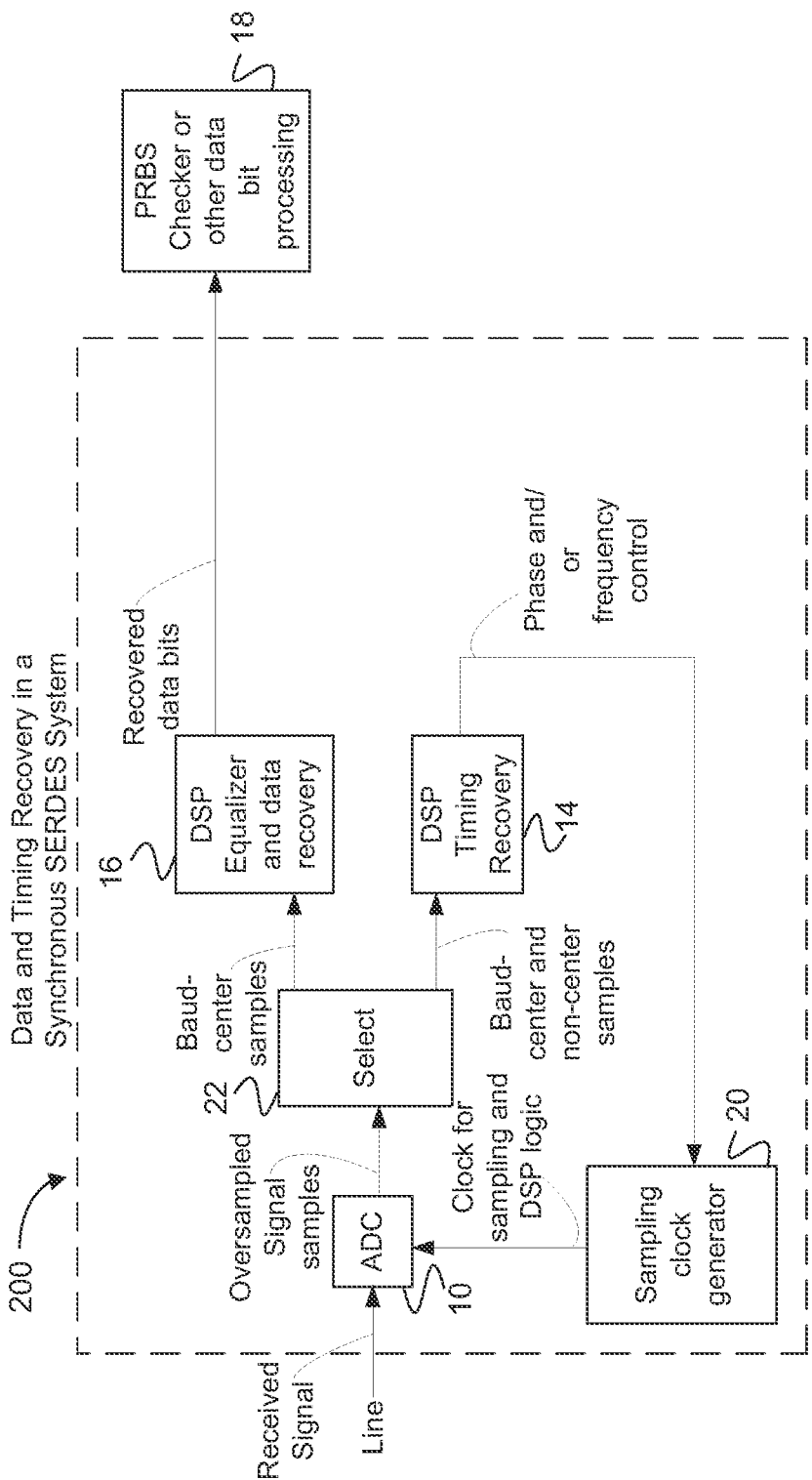
FIG. 2 illustrates another known approach (synchronous) to data and timing recovery in a SERDES system.

FIG. 2 illustrates another known approach (synchronous) to data and timing recovery in a SERDES system 200. In a synchronous system, the sampling clock of the ADC is synchronized to the baud intervals of the received signal.

Synchronous SERDES systems employ a synchronized approach, where the ADC sampling clock is adjusted to be phase locked with the baud intervals of the received signal. The signal from the line is sampled by an ADC 10 and then processed by a select block 22, to obtain samples at the baud center and at the baud edge. In DSP based systems, the timing adjustments are calculated by the timing recovery unit 14 and a timing control signal is supplied by the DSP to a sampling clock generator 20 for the ADC 10.

Figure 3:
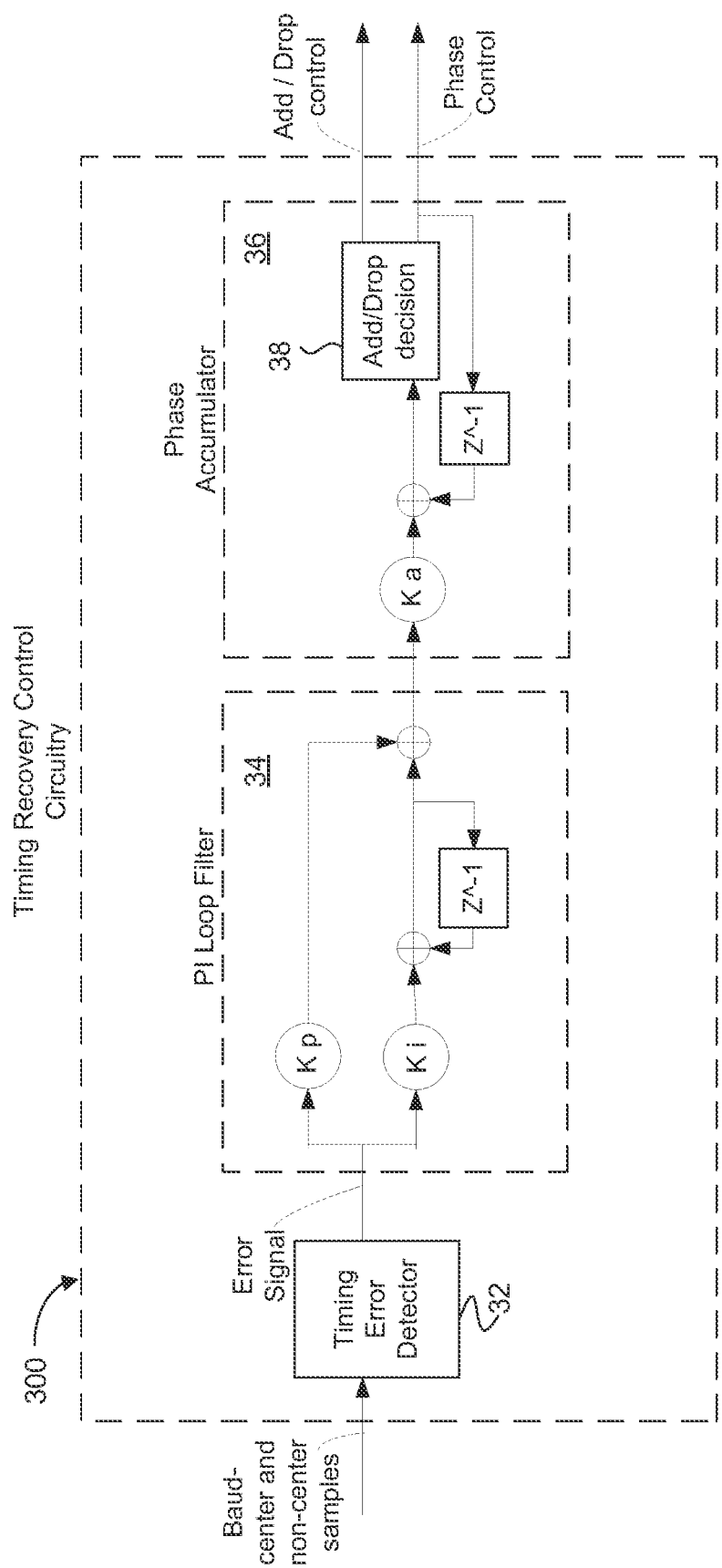
FIG. 3 illustrates a known approach to timing recovery in a timing recovery control circuitry within a DPLL control loop.

FIG. 3 illustrates a known approach to timing recovery in a timing recovery control circuitry 300 within a DPLL control loop. A timing recovery circuit based on the Gardner circuit comprises a Timing Error Detector 32, a Loop Filter 34, a Phase Accumulator 36 and means 38 for signalling sample add/drop events as needed. The Timing Error Detector 32 calculates an error signal based on the timing error present in the signal as sampled and interpolated. This timing error signal is processed in the loop filter 34 that performs the filtering in a Proportional-Integrator (PI) of the closed loop DPLL control system. The phase accumulator 36 calculates the phase control signal by accumulating the output of the loop filter 34. The phase control signal determines the interpolation phase for the samples at the output of the interpolator, and the error detector calculates the error signal based on those samples, thus closing the loop. In the event that the interpolation index wraps around the baud interval, an add or drop event is signalled to add or drop a sample, as needed. This is a common event in the presence of frequency offset, but may also occur under zero frequency event conditions.

In known approaches, the updates are performed once per block and the digital logic for the loop filter 34, phase accumulator 36 and add/drop signalling is clocked at the block rate. If the clock for the digital logic is halved, then the block size must be doubled in order to maintain the received bit rate. As a result, the update rate is halved, which implies slower tracking. This deteriorates performance in the presence of frequency offset, spread spectrum clocking and in test cases with applied Sinusoidal Jitter.

As is well known in the art, tracking may be sped up by widening the loop filter bandwidth. However, this approach transfers more noise from the error noise, which is due to edge jitter, to the control output.

In the present disclosure, the timing control loop is updated once per block. However, the digital logic for the loop filter, phase accumulator and add/drop signalling is clocked at half the block rate, while still producing distinct updates for each block. Thus, performance is maintained while the circuit is operated at half the logic clock rate, and without widening the loop filter. The half-rate DPLL of the present disclosure can also be applied to the synchronous systems, yielding similar benefits.

As is well known in the field of digital logic design for ASICs, reducing the digital logic rate implies a reduction in the speed requirement for the logic libraries cells. As a result, slower cells may be applied, which have lower power consumption. Moreover, pipeline stages may be removed, reducing latency and power consumption in the pipe line registers. Furthermore, by removing pipeline registers between logic operations, logic cells on either side of the removed pipeline registers may be fused and optimized, resulting in fewer cells and lower power for the same logic functions.

The present disclosure provides multi-rate control loop architecture for DPLL implementations. The implementations described herein reduce the DSP clock rate and reduce the need for pipelining and/or high-speed libraries. The attendant benefits include reductions in latency, better tracking performance and lower power consumption.

Figure 4:
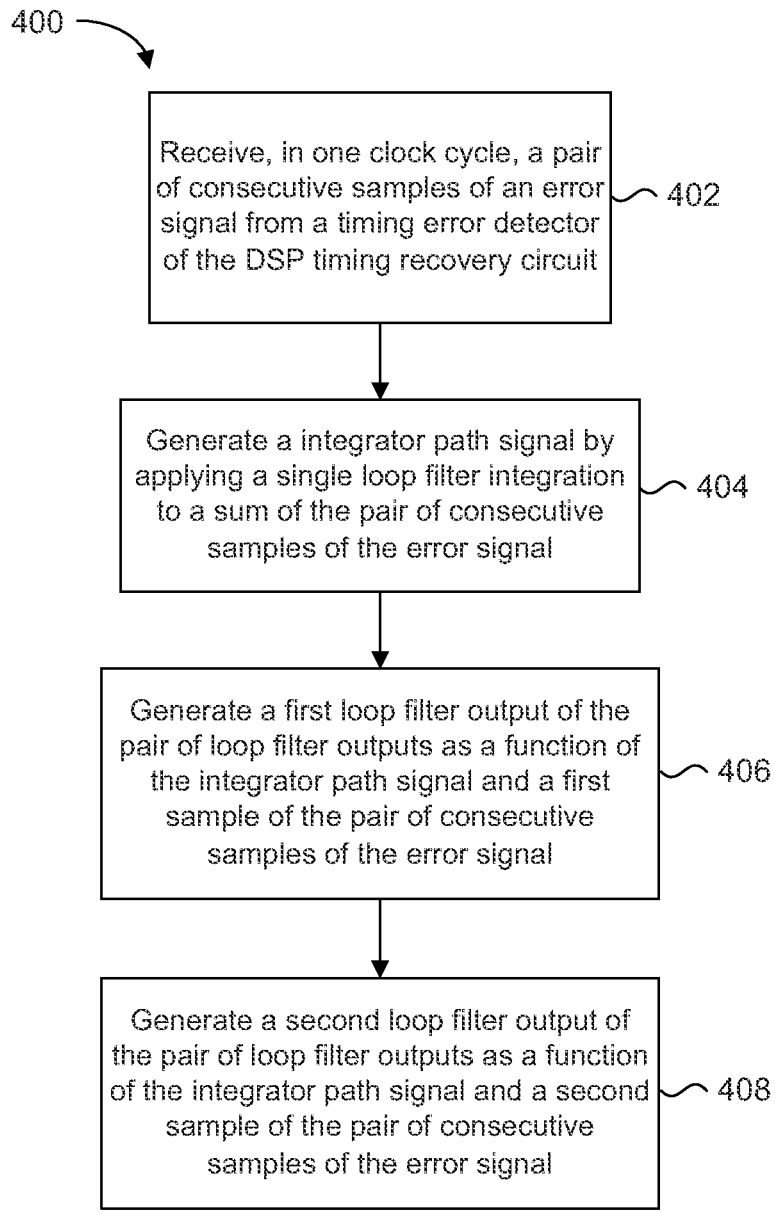
FIG. 4 is a flowchart illustrating a method for generating a pair of loop filter outputs in a DSP timing recovery circuit according to an aspect of the present disclosure.

In an aspect, the present disclosure provides a method for generating a pair of loop filter outputs in a DSP timing recovery circuit as illustrated in the flowchart of FIG. 4. The method comprises, receiving, in one clock cycle, a pair of consecutive samples of an error signal from a timing error detector of the DSP timing recovery circuit (at 402); generating a integrator path signal by applying a single loop filter integration to a sum of the pair of consecutive samples of the error signal (at 404); generating a first loop filter output of the pair of loop filter outputs as a function of the integrator path signal and a first sample of the pair of consecutive samples of the error signal (at 406); and generating a second loop filter output of the pair of loop filter outputs as a function of the integrator path signal and a second sample of the pair of consecutive samples of the error signal (at 408).

It is noted that the notations "first" and "second" do not necessarily imply a sequence in time. These notations are used throughout this disclosure merely for ease of reference and for clarity.

In an example embodiment, a first integrator gain signal may be generated by applying a first integrator gain to the sum of the pair of consecutive samples of the error signal. The integrator path signal may then be generated by applying the single loop filter integrator to the first integrator gain signal.

In another example embodiment, a first proportional gain signal may be generated by applying a first proportional gain to the first sample of the pair of consecutive samples of the error signal. Additionally, a second integrator gain signal may be generated by applying a second integrator gain to the second sample of the pair of consecutive samples of the error signal. An intermediate loop filter signal may then be generated by subtracting the second integrator gain signal from the integrator path signal. A second proportional gain signal may be generated by applying a second proportional gain to the second sample of the pair of consecutive samples of the error signal. The first loop filter output of the pair of loop filter outputs may then be generated by summing the first proportional gain signal and the intermediate loop filter signal. The second loop filter output of the pair of loop filter outputs may then be generated by summing the second proportional gain signal and the integrator path signal.

In another example embodiment, the method may further comprise buffering an output of the timing error detector at a full-rate clock cycle. The pair of consecutive samples of the error signal may then be generated from the buffered output at a half-rate clock cycle.

In an aspect, the present disclosure provides loop filter for generating a pair of loop filter outputs from a pair of consecutive samples of an error signal provided by a timing error detector of a DSP timing recovery circuit. The loop filter comprises a single loop filter integrator, a first loop filter output generator and a second loop filter generator. The single loop filter integrator is configured to generate an integrator path signal from a sum of the pair of consecutive samples of the error signal. The first loop filter output generator is configured to generate a first loop filter output of a pair of loop filter outputs as a function of the integrator path signal and a first sample of the pair of consecutive samples of the error signal. The second loop filter output generator is configured to generate a second loop filter output of the pair of loop filter outputs as a function of the integrator path signal and a second sample of the pair of consecutive samples of the error signal.

Figure 5:
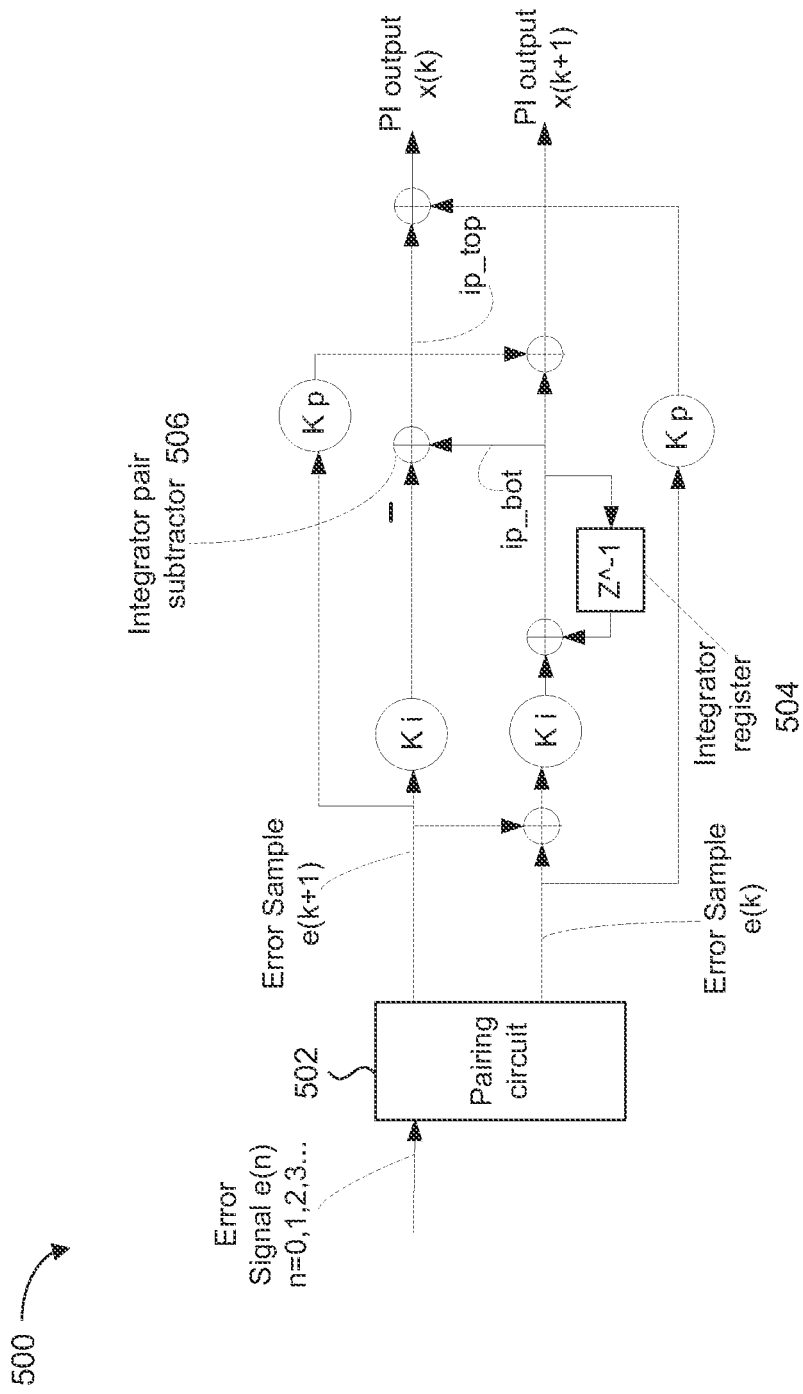
FIG. 5 illustrates a half-rate loop filter architecture to implement the method of FIG. 4 according to an example embodiment of the present disclosure.

FIG. 5 illustrates a half-rate loop filter architecture 500 to implement the method of FIG. 4 according to an example embodiment of the present disclosure. The error signal e(n) is sampled to generate a first error sample e(k) and a second error sample e(k+1). A first integrator gain (Ki) is applied to the sum of the pair of consecutive samples (e(k)+e(k+1)) of the error signal. An integrator path signal (ip_bot) is then generated by applying the single loop filter integrator including the integrator register 504. A second integrator gain (Ki) is applied to the second error sample to generate a second integrator gain signal. An intermediate loop filter signal (ip_top) is then generated by subtracting the second integrator gain signal from the integrator path signal using the integrator pair subtractor 506. Thus, the intermediate loop filter signal is a function of the integrator path signal.

A first proportional gain signal is generated by applying a first proportion gain (Kp) to the first error sample (e(k)). Similarly, a second proportional gain signal is generated by applying a second proportional gain (Kp) to the second error sample (e(k+1)). The first loop filter output is a function of the integrator path signal and a first sample of the pair of consecutive samples of the error signal. In the example embodiment of FIG. 5, the first loop filter output x(k) is generated by summing the first proportional gain signal and the intermediate loop filter signal (ip_top). The second loop filter output is a function of the integrator path signal and a second sample of the pair of consecutive samples of the error signal. In the example embodiment of FIG. 5, the second loop filter output x(k+1) is generated by summing the second proportional gain signal and the integrator path signal (ip_bot).

In the example embodiment, the loop filter may further comprise a pairing circuit may be configured to receive the error signal at a full-rate clock cycle and to generate a pair of consecutive loop filter outputs at a half-rate clock cycle. In the example embodiment of FIG. 5, the half-rate loop filter architecture 500 includes pairing circuit 502. The pairing circuit 502 may include buffer registers (not shown in FIG. 5, see for example, FIG. 14) that buffer the error signal e(n) clocked at full-rate clock cycle n=0, 1, 2, 3, . . . output from a timing error detector (not shown in FIG. 5, see for example, timing error detector 32 in FIG. 3). The pairing circuit 502 then produces a pair of consecutive samples e(k) and e(k+1) at a half-rate clock cycle for further processing the loop filter of the present disclosure.

In another example, the method may further comprise generating a serialized loop filter output at the full-rate clock cycle by serializing the first loop filter output and the second loop filter output. A phase control and/or add/drop control signal may then be generated by accumulating the serialized loop filter output.

Figure 6:
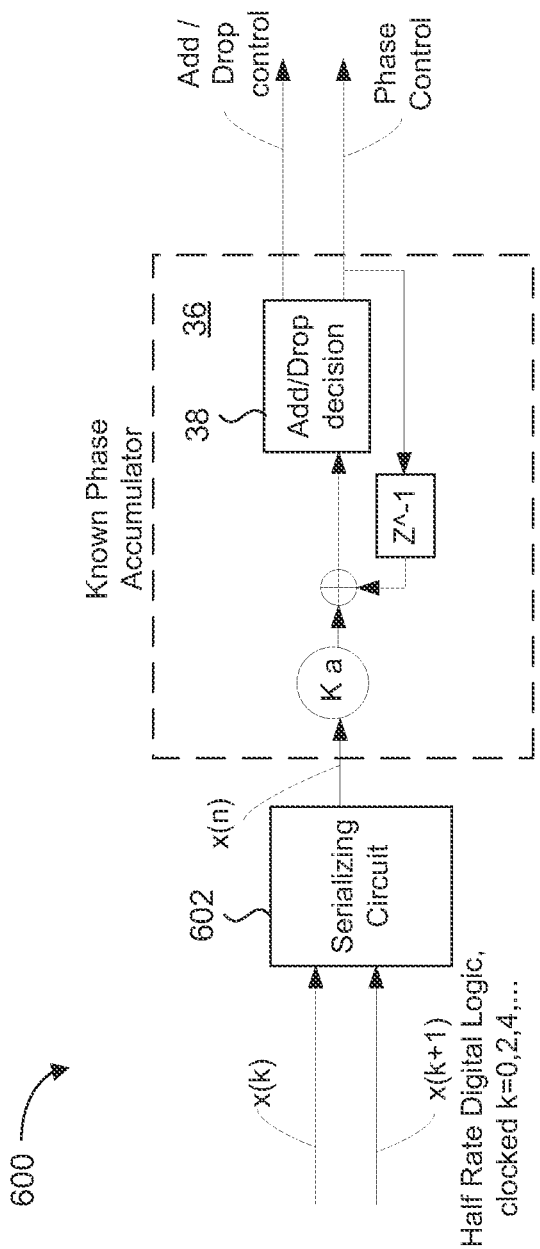
FIG. 6 illustrates loop filter outputs from the half-rate loop filter architecture of FIG. 5 being used in conjunction with a known accumulator architecture to generate phase control signals in a DSP timing recover circuit according to an example embodiment of the present disclosure.

FIG. 6 illustrates loop filter outputs from the half-rate loop filter architecture of FIG. 5 being used in conjunction with a known accumulator architecture to generate phase control signals in a DSP timing recover circuit according to an example embodiment of the present disclosure.

The loop filter outputs x(k) and x(k+1), for example, from the half-rate loop filter architecture are received by a serializing circuit 602 to generate a serialized loop filter output x(n) at the full-rate clock cycle. The serialized loop filter output x(n) is then processed by a known phase accumulator, for example, phase accumulator 36, including a add/drop decision module 38 to generate the phase control and add/drop control signals.

Figure 7:
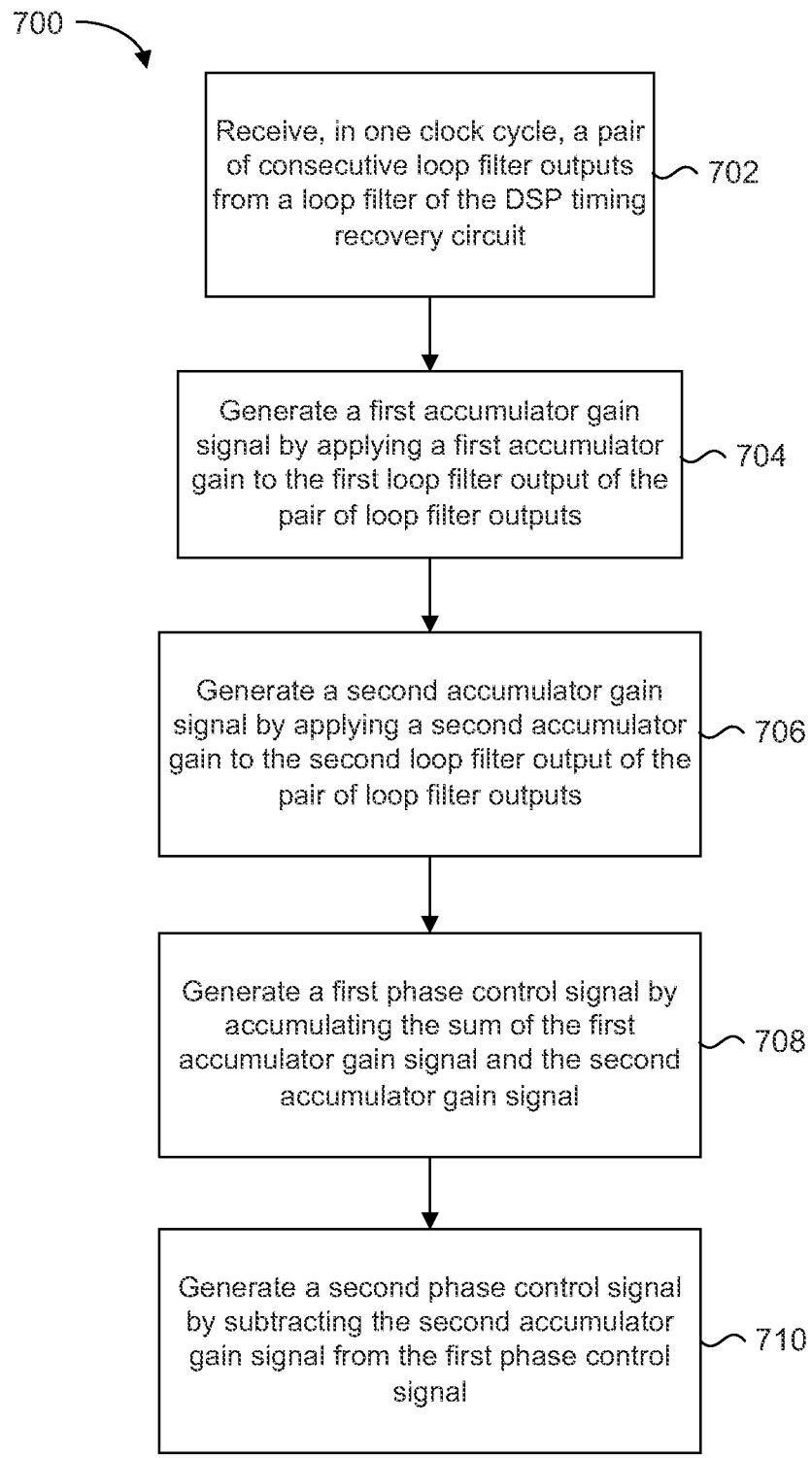
FIG. 7 is a flowchart illustrating a method for generating phase control signals in a DSP timing recovery circuit according to an aspect of the present disclosure.

In an aspect, the present disclosure provides a method for generating a pair of phase control signals in a DSP timing recovery circuit as illustrated in the flowchart of FIG. 7. The method comprises, receiving, in one clock cycle, a pair of consecutive loop filter outputs from a loop filter of the DSP timing recovery circuit (at 702); generating a first accumulator gain signal by applying a first accumulator gain to the first loop filter output of the pair of loop filter outputs (at 704); generating a second accumulator gain signal by applying a second accumulator gain to the second loop filter output of the pair of loop filter outputs (at 706); generating a first phase control signal by accumulating the sum of the first accumulator gain signal and the second accumulator gain signal (at 708); and generating a second phase control signal by subtracting the second accumulator gain signal from the first phase control signal (at 710).

In an example embodiment, the method may further comprise modifying the first phase control signal and the second phase control signal based on a threshold signal. When the first phase control signal is greater than the threshold signal, the first phase control signal may be modified by subtracting the threshold signal from the first phase control signal. When the first phase control signal is less than the inverse of the threshold signal, the first phase control signal may be modified by adding the threshold signal to the first phase control signal. The second phase control signal may then be modified by generating the second phase control signal based on the modified first phase control signal.

In an example embodiment, the method may further comprise determining an add/drop control signal based on the first phase control signal and the threshold signal. The add/drop control signal may correspond to an add signal when the first phase control signal is greater than the threshold signal and to a drop signal when the first phase control signal is less than the inverse of the threshold signal.

In the aspect, the present disclosure provides an accumulator for generating a pair of phase control signals in a DSP timing recovery circuit. The accumulator comprises an accumulator register and an accumulator pair subtractor. The accumulator is configured to receive, in one clock cycle, a pair of consecutive loop filter outputs from a loop filter of the DSP timing recovery circuit; generate a first accumulator gain signal by applying a first accumulator gain to the first loop filter output of the pair of loop filter outputs; generate a second accumulator gain signal by applying a second accumulator gain to the second loop filter output of the pair of loop filter outputs; generate a first phase control signal by accumulating the sum of the first accumulator gain signal and the second accumulator gain signal; and generate a second phase control signal by subtracting the second accumulator gain signal from the first phase control signal.

In an example embodiment, the accumulator may further comprise a pairing circuit configured to receive a loop filter output at a full-rate clock cycle and to generate a pair of consecutive loop filter outputs at a half-rate clock cycle.

In an example embodiment, the accumulator may further comprise an add/drop decision module configured to modify the first phase control signal and the second phase control signal based on a threshold signal. The add/drop decision module may be further configured to: modify the first phase control signal by subtracting the threshold signal from the first phase control signal when the first phase control signal is greater than the threshold signal, or modify the first phase control signal by adding the threshold signal to the first phase control signal when the first phase control signal is less than the inverse of the threshold signal; and modify the second phase control signal by generating the second phase control signal based on the modified first phase control signal.

In an example embodiment, the add/drop decision module may be further configured to determine an add/drop control signal based on the first phase control signal and the threshold signal. The add/drop control signal may correspond to an add signal when the first phase control signal is greater than the threshold signal and to a drop signal when the first phase control signal is less than the inverse of the threshold signal.

Figure 8:
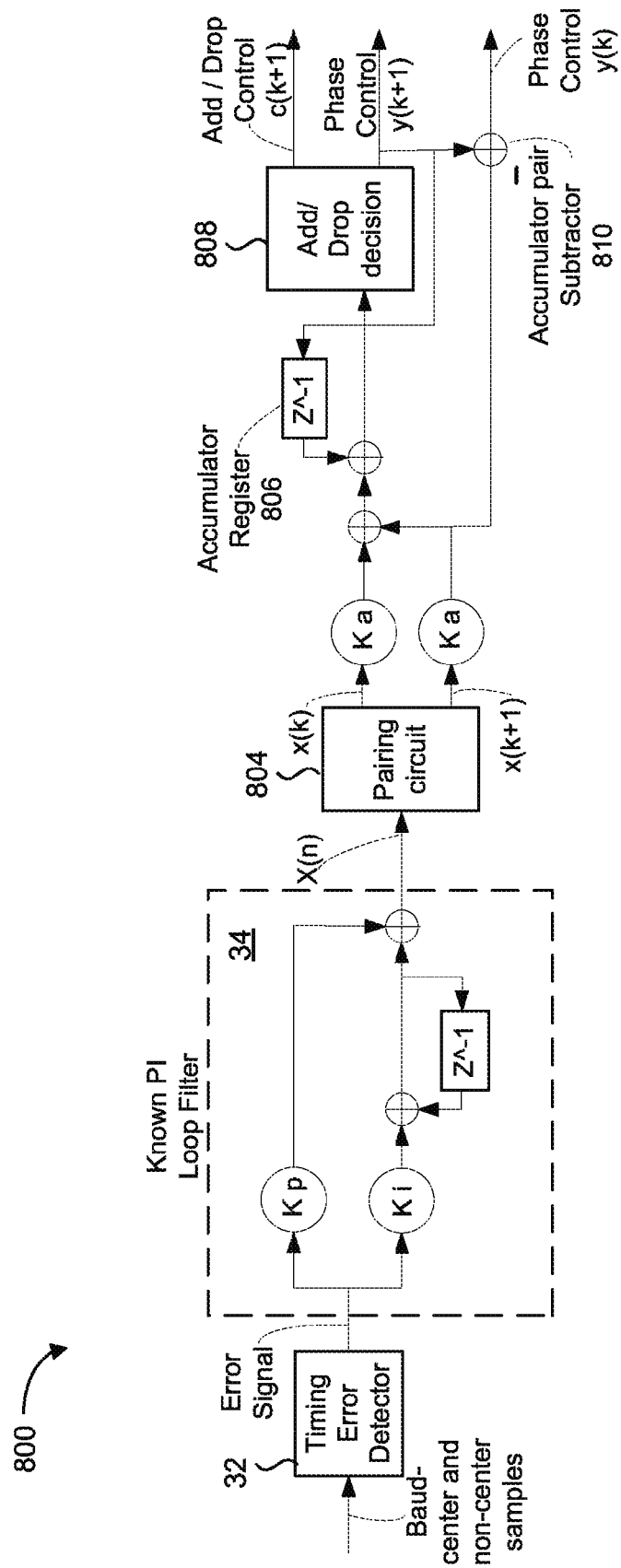
FIG. 8 illustrates loop filter outputs from known loop filter architecture being used in conjunction with a half-rate accumulator architecture implementing the method of FIG. 7 to generate phase control signals in a DSP timing recover circuit according to an example embodiment of the present disclosure.

FIG. 8 illustrates loop filter outputs from known loop filter architecture being used in conjunction with a half-rate accumulator architecture implementing the method of FIG. 7 to generate phase control signals in a DSP timing recover circuit according to an example embodiment of the present disclosure.

The DPLL control system 800 includes a timing error detector 32 calculates an error signal based on the timing error present in the signal as sampled and interpolated. This timing error signal is processed in the loop filter 34 that performs the filtering in a Proportional-Integrator (PI) of the closed loop DPLL control system 800.

The pairing circuit 804 is configured to receive the output x(n) of the loop filter 34 and generate a pair of consecutive loop filter outputs x(k) and x(k+1). The accumulator is configured to generate a first accumulator gain signal by applying a first accumulator gain (Ka) to the first loop filter output x(k). The accumulator is also configured to generate a second accumulator gain signal by applying a second accumulator gain (Ka) to the second loop filter output x(k+1). The accumulator is further configured to generate a first phase control signal y (k+1) by accumulating, using the accumulator register 806, the sum of the first accumulator gain signal and the second accumulator gain signal and to generate a second phase control signal y(k) by subtracting, using the accumulator pair subtractor 810, the second accumulator gain signal from the first phase control signal.

In the example DPLL control system 800 of FIG. 8, the add/drop decision module 808 is configured to modify the first phase control signal and second phase control signal based on a threshold signal. The first phase control signal may be modified by subtracting the threshold signal from the first phase control signal when the first phase control signal is greater than the threshold signal. The first phase control signal may be modified by adding the threshold signal to the first phase control signal when the first phase control signal is less than the inverse of the threshold signal. The add/drop decision module is further configured to modify the second phase control signal by generating the second phase control signal based on the modified first phase control signal.

The add/drop decision module 808 is further configured to determine an add/drop control signal c(k+1) based on the first phase control signal y(k+1) and the threshold signal. The add/drop control signal may correspond to an add signal when the first phase control signal is greater than the threshold signal and to a drop signal when the first phase control signal is less than the inverse of the threshold signal.

Figure 9:
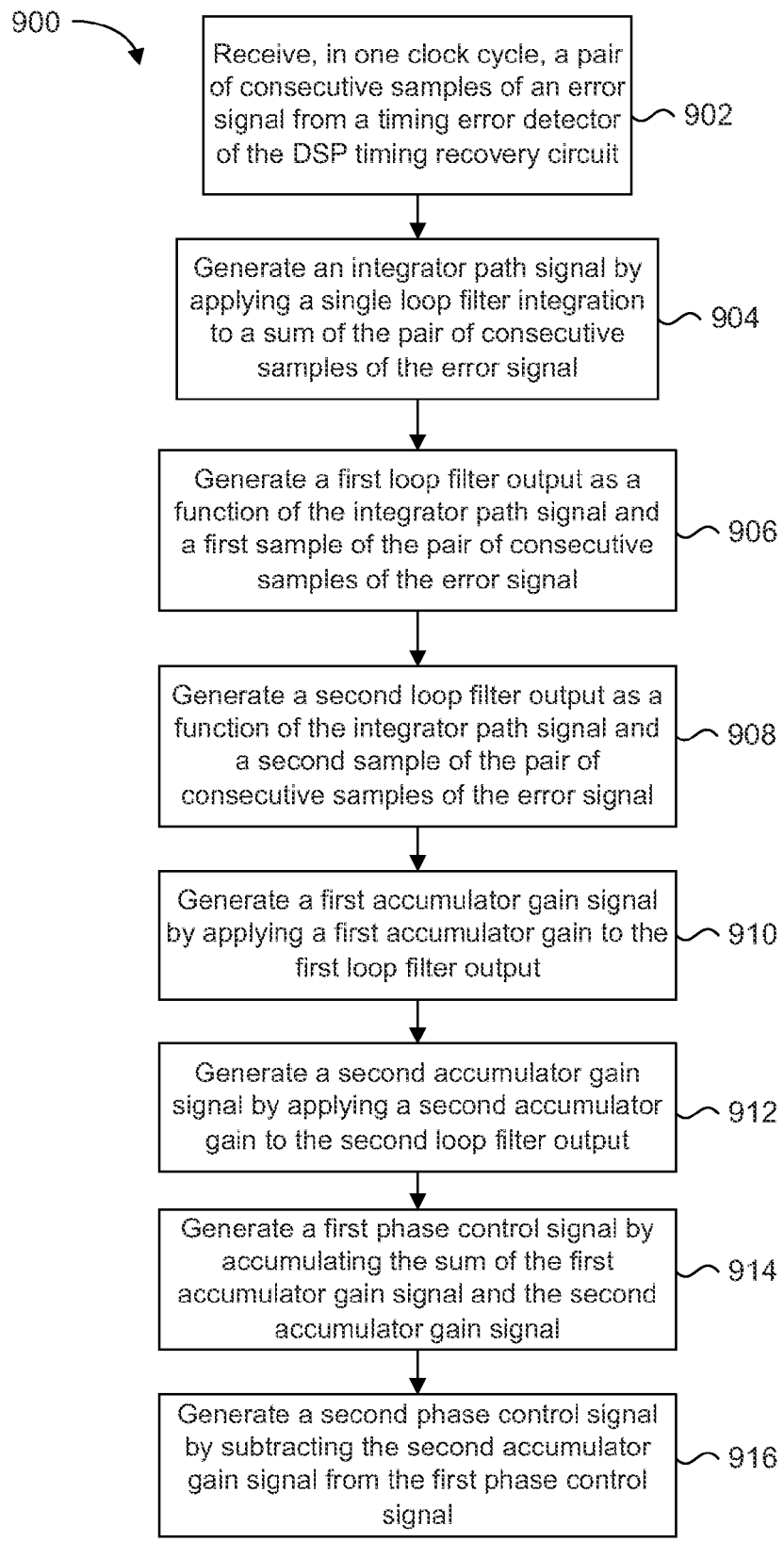
FIG. 9 is a flowchart illustrating a method for generating phase control signals in a DSP timing recovery circuit according to an aspect of the present disclosure.

In an aspect, the present disclosure provides a method for generating a pair of phase control signals in a DSP timing recovery circuit as illustrated in the flowchart of FIG. 9. The method 900 comprises, receiving, in one clock cycle, a pair of consecutive samples of an error signal from a timing error detector of the DSP timing recovery circuit (at 902); generating a integrator path signal by applying a single loop filter integration to a sum of the pair of consecutive samples of the error signal (at 904); generating a first loop filter output as a function of the integrator path signal and a first sample of the pair of consecutive samples of the error signal (at 906); generating a second loop filter output as a function of the integrator path signal and a second sample of the pair of consecutive samples of the error signal (at 908); generating a first accumulator gain signal by applying a first accumulator gain to the first loop filter output (at 910); generating a second accumulator gain signal by applying a second accumulator gain to the second loop filter output (at 912); generating a first phase control signal by accumulating the sum of the first accumulator gain signal and the second accumulator gain signal (at 914); and generating a second phase control signal by subtracting the second accumulator gain signal from the first phase control signal (at 916).

In an example embodiment, a first integrator gain signal may be generated by applying a first integrator gain to the sum of the pair of consecutive samples of the error signal. The integrator path signal may then be generated by applying the single loop filter integration to the first integrator gain signal.

In an example embodiment, a second integrator gain signal may be generated by applying a second integrator gain to the second sample of the pair of consecutive samples of the error signal. An intermediate loop filter signal may then be generated by subtracting the second integrator gain signal from the integrator path signal.

A first proportional gain signal may be generated by applying a first proportional gain to the first sample of the pair of consecutive samples of the error signal. A second proportional gain signal may be generated by applying a second proportional gain to the second sample of the pair of consecutive samples of the error signal. The first loop filter output may be generated by summing the first proportional gain signal and the intermediate loop filter signal. The second loop filter output may be generated by summing the second proportional gain signal and the integrator path signal.

In an example embodiment, the method may further comprise buffering output of the timing error detector at a full-rate clock cycle; and generating the pair of consecutive samples of the error signal from the buffered output at a half-rate clock cycle.

In an example embodiment, the first phase control signal and the second phase control signal may be modified based on a threshold signal. The first phase control signal may be modified by subtracting the threshold signal from the first phase control signal when the first phase control signal is greater than the threshold signal. Alternatively, the first phase control signal may be modified by adding the threshold signal to the first phase control signal when the first phase control signal is less than the inverse of the threshold signal. The second phase control signal may then be modified by generating the second phase control signal based on the modified first phase control signal.

In an example embodiment, an add/drop control signal may be determined based on the first phase control signal and the threshold signal. The add/drop control signal may correspond to an add signal when the first phase control signal is greater than the threshold signal and to a drop signal when the first phase control signal is less than the inverse of the threshold signal.

In an aspect, the present disclosure provides a phase control signal generator for generating a pair of phase control signals from a pair of consecutive samples of an error signal provided by a timing error detector of a DSP timing recovery circuit. The phase control signal generator comprises a single loop filter integrator, a first loop filter output generator, a second loop filter output generator, and an accumulator. The single loop filter integrator is configured to generate an integrator path signal from a sum of the pair of consecutive samples of the error signal. The first loop filter output generator is configured to generate a first loop filter output as a function of the integrator path signal and a first sample of the pair of consecutive samples of the error signal. The second loop filter output generator is configured to generate a second loop filter output as a function of the integrator path signal and a second sample of the pair of consecutive samples of the error signal. The accumulator is configured to: generate a first accumulator gain signal by applying a first accumulator gain to the first loop filter output; generate a second accumulator gain signal by applying a second accumulator gain to the second loop filter output; generate a first phase control signal by accumulating the sum of the first accumulator gain signal and the second accumulator gain signal; and generate a second phase control signal by subtracting the second accumulator gain signal from the first phase control signal.

In an example embodiment, the phase control signal generator may further comprise a pairing circuit configured to receive the error signal at a full-rate clock cycle and to generate a pair of consecutive loop filter outputs at a half-rate clock cycle.

In an example embodiment, the phase control signal generator may further comprise an add/drop decision module configured to modify the first phase control signal and the second phase control signal based on a threshold signal. Additionally, the add/drop decision module may be configured to determine an add/drop control signal based on the first phase control signal and the threshold signal.

Figure 10:
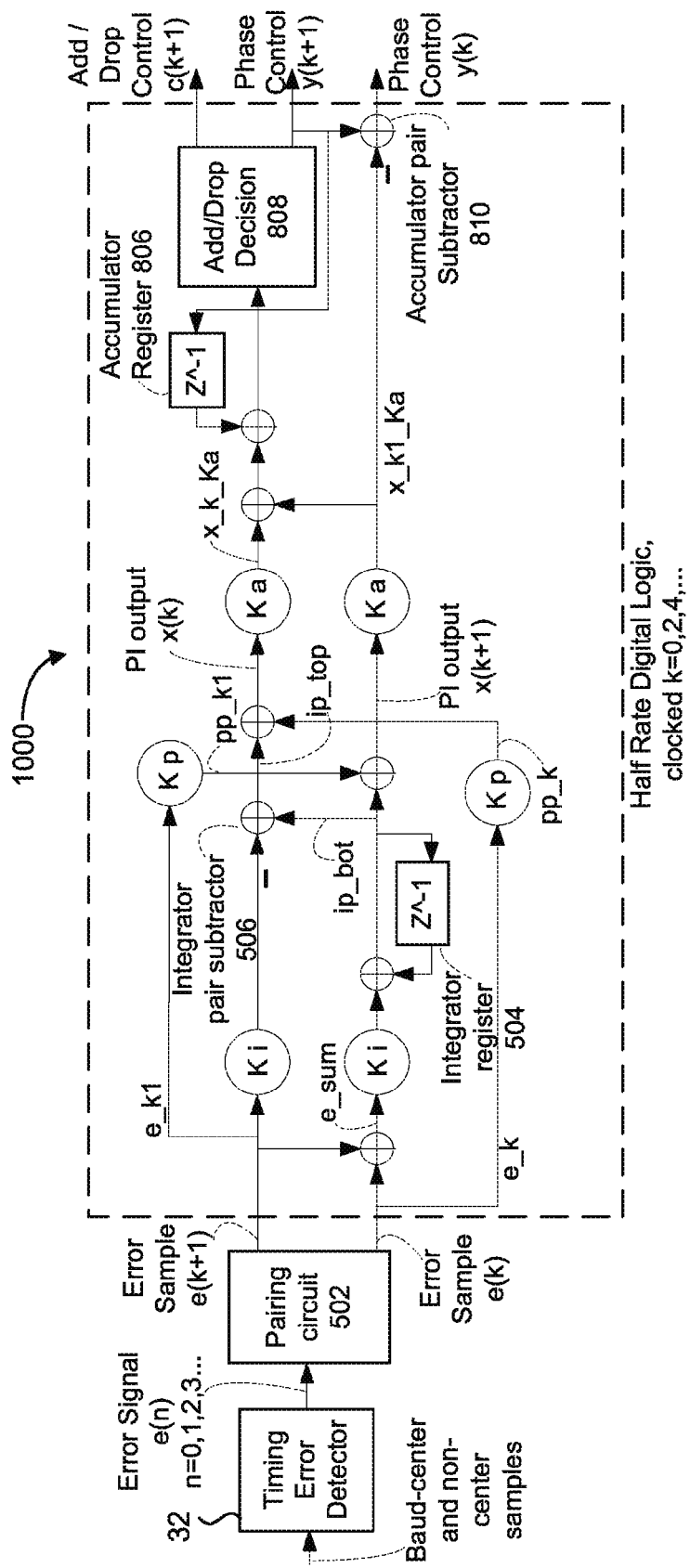
FIG. 10 illustrates an approach to timing recovery in a timing recovery control circuitry within a DPLL control loop at half-rate implementing the method of FIG. 9 according to an example embodiment of the present disclosure.

FIG. 10 illustrates an approach to timing recovery in a timing recovery control circuitry 1000 within a DPLL control loop at half-rate implementing the method of FIG. 9 according to an example embodiment of the present disclosure.

The output error signal e(n) of a full rate timing error detector 32 is buffered in holding registers of a pairing circuit 502 so that at one half-rate cycle, a pair of error signal values or samples e(k) and e(k+1) is available for processing. It is well known in the art of multi-rate DSP that half-rate processing is performed on pairs of sequential samples, formed by grouping an odd sample with a neighbouring even sample. In an example embodiment, the half-rate digital logic operates at the pair of samples simultaneously.

Figure 14:
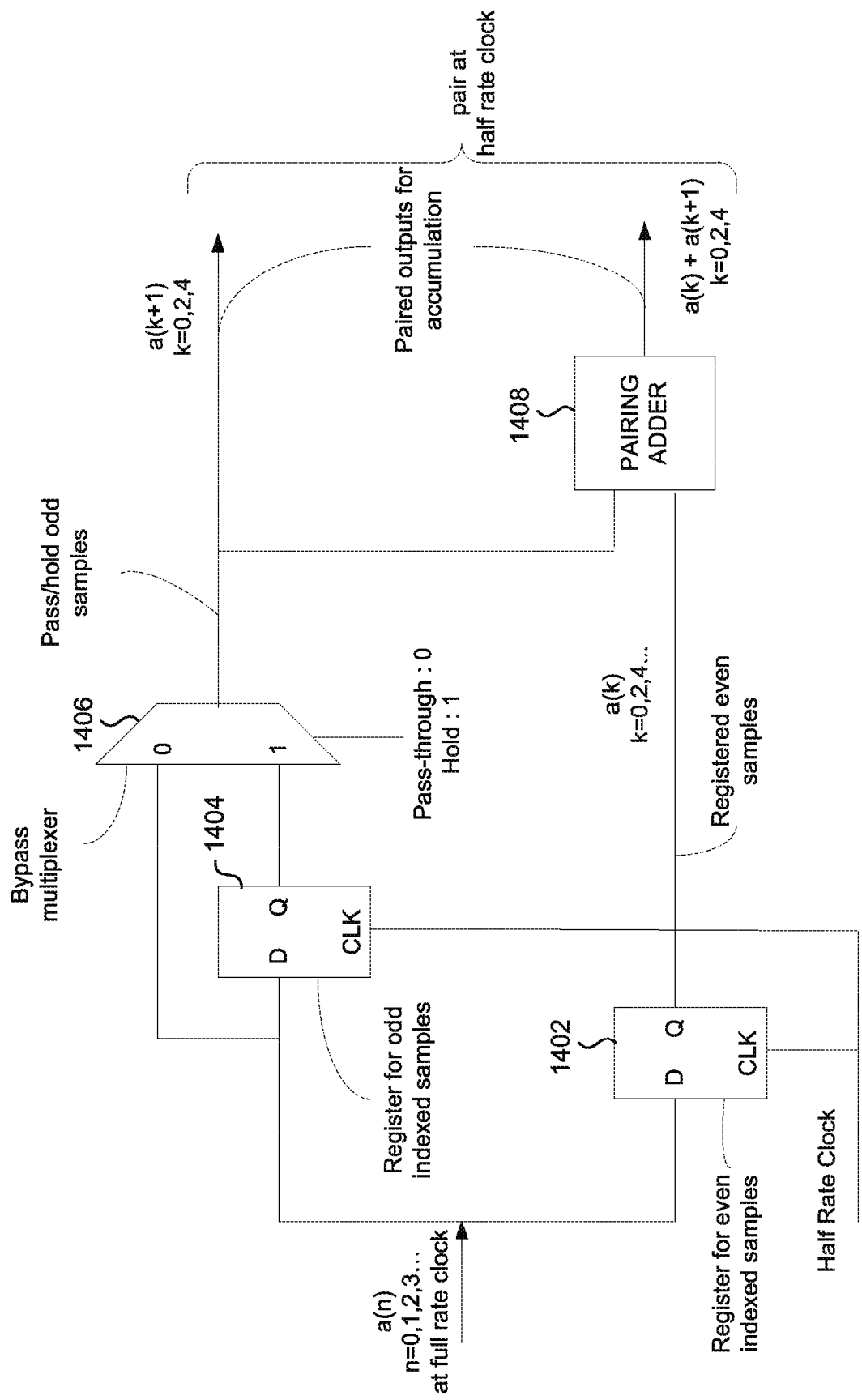
FIG. 14 is a pairing adder according to an example embodiment of the present disclosure.

With reference to the FIG. 10, error signal samples e_k, e_k1, where k is the index into a sampled signal, are available at the output of a pairing circuit 502 (see also FIG. 14). Then, the PI loop filter and the phase accumulator operate on pairs of signal samples at half-rate clock cycles.

The half-rate DPLL performs the following calculations in each half-rate clock cycle: (1) Receive the current and next sample of the error signal: e(k)=e_k and e (k+1)=e_k1; (2) Generate the sum of the pair of consecutive samples of the error signal: e_sum=e_k+e_k1; (3) Generate proportional gain signals (the Proportional path of the loop filter), with gain Kp, pp_k=Kp*e_k and pp_k1=Kp*e_k1; (4) Generate integrator gain signals (the Integrator path of the loop filter), with gain Ki, ip_bot+=Ki*e_sum; ip_top=ip_bot−Ki*e_k1; (6) Generate loop filter outputs x_k=ip_top+pp_k and x_k1=ip_bot+pp_k1; (7) Generate the phase accumulator input by applying gain Ka, x_k_Ka=Ka*x_k, and x_k1_Ka=Ka*x_k1; (8) Calculate the phase accumulator output: acc+=x_k_Ka+x_k1_Ka; (9) Conditionally apply an add/drop based on a threshold Ta: if acc>ta, then acc−=Ta, ad=1; else if acc<−Ta, acc+=Ta, ad=−1; else acc=acc, ad=0; and (10) Produce the phase control signals: y_k1=acc; y_k=y_k1−x_k1_Ka.

The half-rate clock cycles occur at times k=0,2,4, . . . etc., thus highlighting that at times k=1,3,5 . . . etc., the clock is not cycled thus leaving double the clock period for the arithmetic operations.

The selection of Kp and Ki are well known in the art of DPLL design and control loop design, and depend on the desired phase tracking speed, phase convergence time, frequency convergence time and noise rejection. In the art of DSP, it is well known that the multipliers, adders and delays may be moved to still yield identical functionality and performance. Moreover it is well known that pipeline delays (not shown) may be added and moved to aid in the digital logic timing closure during the logic gate synthesis phase of the design. The fixed-point or floating format of the signals depends on the desired signal swing and resolution. The maximum word size of the signals is usually limited by the clock speed, e.g. 8-bits, 10 bits or even 12 bits. Moreover, other arithmetic circuits such as rounding, truncation and saturation operations are also inserted to aid in containing the word sizes and keeping the design stable.

It is noted that the gains Ki, Kp, and Ka are referenced using the same notations throughout the present disclosure. However, the gains referred to using the same notation do not necessarily represent the same gain values and may be different according to design choice.

Figure 11:
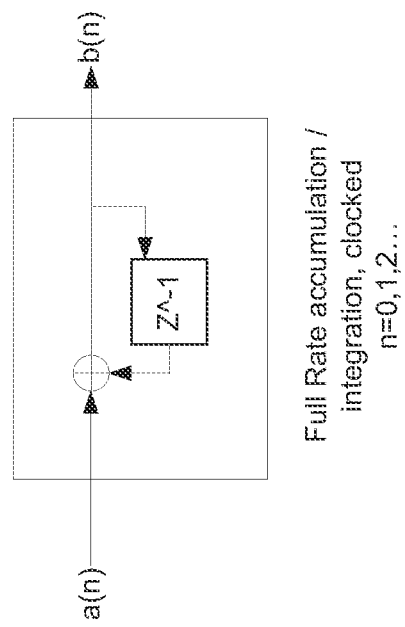
FIG. 11 illustrates a full-rate accumulation/integration according to a known approach.
Figure 12:
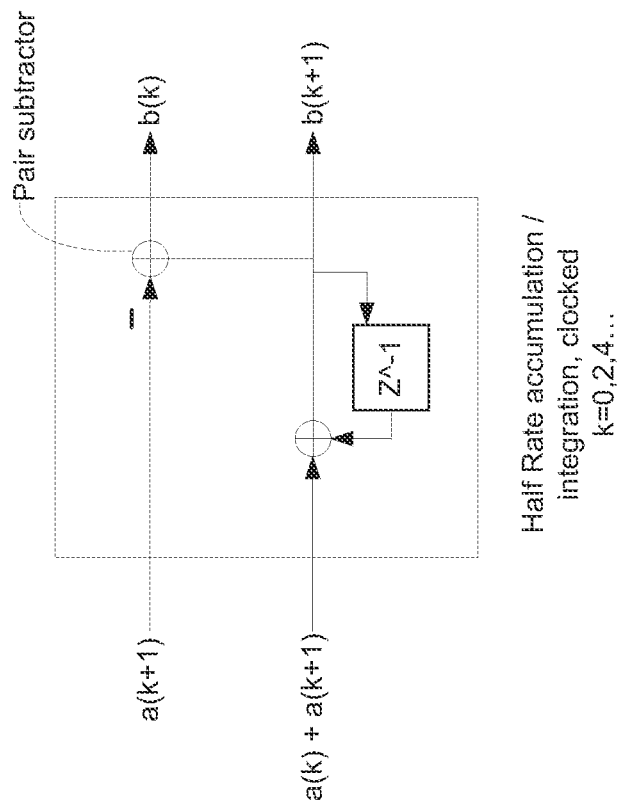
FIG. 12 illustrates a half-rate accumulation/integration according to an example embodiment of the present disclosure.

A salient feature and part of the implementations of the present disclosure is the accumulation (or integration) of signals at half-rate using an accumulation (or integration) structure shown in FIG. 12 and is discussed in relation to the full-rate accumulation/integration implementation of known systems depicted in FIG. 11.

With reference to FIG. 11, in the full-rate accumulation/integration implementation of known systems, the output b(n) is calculated from the input a(n) at every full-rate clock cycle n=0,1,2, . . . etc. The output is simply an accumulation of the input. The sequence of samples is illustrated in Table 1.

In the half-rate accumulation/integration implementation of the present disclosure as shown in FIG. 12, a pair subtractor calculates b(k) from b(k+1) and a(k+1). In the present disclosure, a paired output is obtained using a paired input. The paired processing is performed at half the processing rate of the prior art accumulator/integrator. Thus, the processing circuit is clocked at half the clock rate of the prior art circuit. The sequence of samples for the full-rate accumulation/integration implementation of known systems and the half-rate accumulation/integration of the present disclosure is illustrated in Table 1.

at the input. This positive edge of the half-rate clock coincides with a positive edge of the full-rate clock and the input to the pairing circuit becomes a1.

(2) While the half-rate clock is HIGH, sample a1 is passed around the register for odd samples and is available as output a(k+1). The bypass multiplexer is in position 0 for pass-through.

(3) The pairing adder calculates a0+a1 and the pairing circuit provides a1 and a0+a1 at its output. This pairs a0 with a1.

(4) At the negative edge of the half-rate clock, the register for odd samples captures a1. This negative edge of the half-rate clock coincides with a positive edge of the full-rate clock and the input to the pairing circuit becomes a2.

(5) While the half-rate clock is LOW, sample a1 is at the output of the register for odd samples. Output a(k+1) is held at a1. Thus the pairing circuit continues to provide a1 and a0+a1 at its output. The bypass multiplexer is in position 1 for hold.

(6) k=2: At the positive edge of the half-rate clock, the register for even samples captures input sample a2. This positive edge of the half-rate clock coincides with a positive edge of the full-rate clock and the input to the pairing circuit becomes a3.

(7) While the half-rate clock is HIGH, sample a3 is passed around the register for odd samples and available as output a(k+1). The bypass multiplexer is in position 0 for pass-through.

(8) The pairing adder calculates a2+a3 and the pairing circuit provides a2 and a2+a3 at its output.

(9) At the negative edge of the half-rate clock, the register for odd samples captures a3, and the input to the pairing circuit is a4. This negative edge of the half-rate clock coin-

TABLE 1

Illustration of Full Rate and Half Rate Accumulation

| | | Full Rate Output | | | | Half Rate Accumulated Output Pair | |
|---|---|---|---|---|---|---|---|
| | a(n) | b(n) | | a(k) | a(k+1) | b(k) | b(k+1) |
| n = 0 | a0 | a0 | | | | | |
| n = 1 | a1 | a0 + a1 | k = 0 | a0 | a1 | (a0 + a1) − a1 = a0 | a0 + a1 |
| n = 2 | a2 | a0 + a1 + a2 | | | | | |
| n = 3 | a3 | a0 + a1 + a2 + a3 | k = 2 | a2 | a3 | (a2 + a3) + (a0 + a1) − a3 = a0 + a1 + a2 | (a2 + a3) + (a0 + a1) = a0 + a1 + a2 + a3 |

In the half-rate accumulator/integrator of the present disclosure, an output pair comprising b(k) and b(k+1) is calculated from an input pair comprising a(k+1) and the sum a(k)+a(k+1). The ensuing sequence of signal samples (or general numbers) is illustrated in Table 1 as well. As illustrated, the output sequences are identical to the prior art full-rate implementation.

Figure 13:
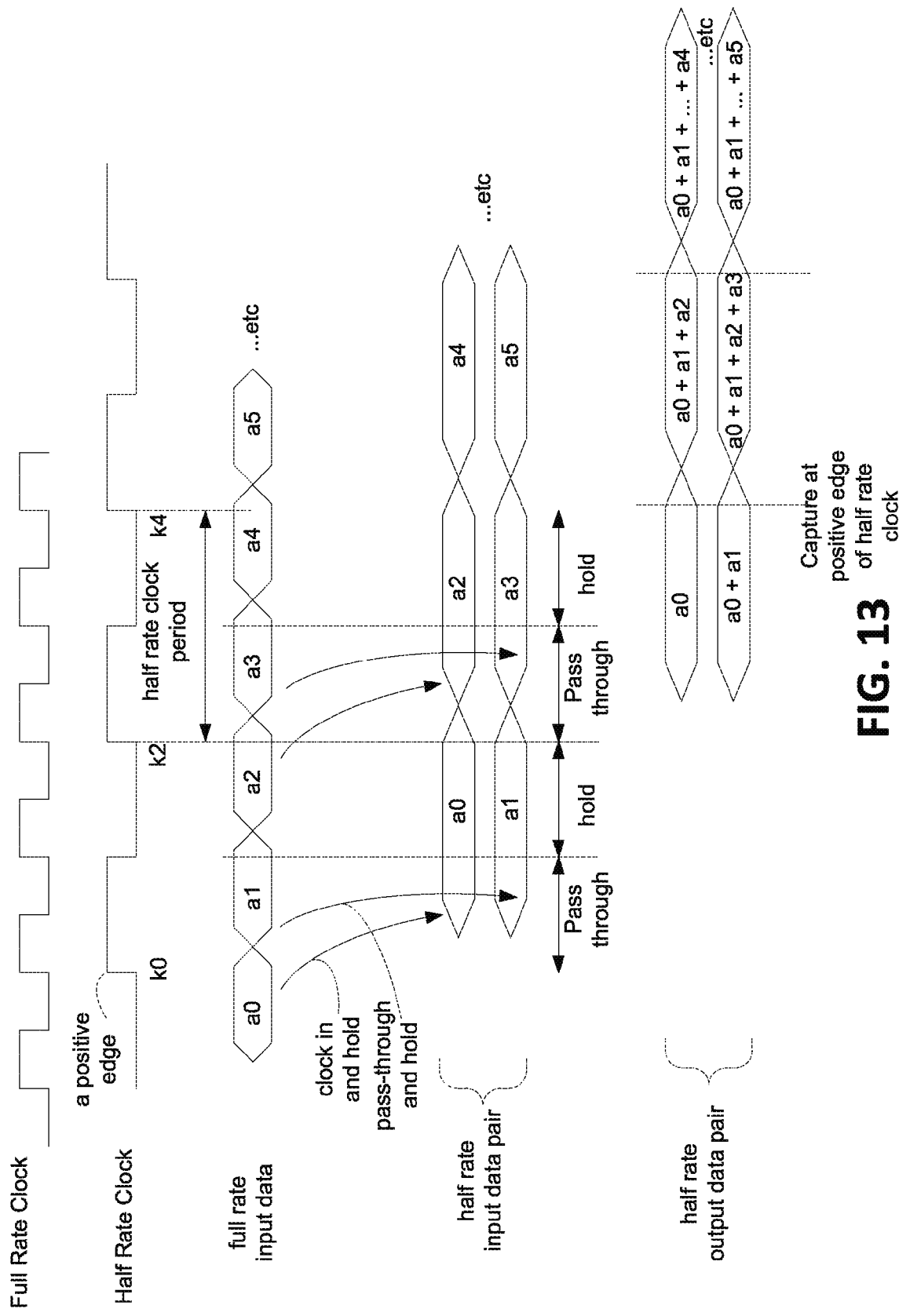
FIG. 13 is a timing diagram for half-rate accumulation/integration according to an example embodiment of the present disclosure.

The timing diagram in FIG. 13 illustrates the accumulation in Table 1 over time. The full-rate input data is updated with the positive (rising) edge of a full-rate clock. The input data is paired and updated at the positive edge of a half-rate clock. An explanation of the pairing of input samples now follows, with reference to FIGS. 13 and 14. Input samples a(n) with n=0, 1,2,3 at the full clock rate are applied to a register for even samples and also to a register with a by-pass multiplexer for odd samples. The pairing adder, an adder circuit comprised of combinational logic, performs the required pairing addition.

(1) k=0: At the positive edge of the half-rate clock, the register for even samples captures input sample a0, available cides with a positive edge of the full-rate clock and the input to the pairing circuit becomes a4.

(10) While the half-rate clock is LOW, sample a3 is at the output of the register for odd samples holding output a(k+1) at a3. Thus, the pairing circuit continues to provide a2 and a2+a3 at its output. The bypass multiplexer is in position 1 for hold.

The above sequence continues for k=4, 6, 8 etc. . . . to pair input sample a4 with a5, then a6 with a7, etc.

It is noted that the input samples are provided at the full-rate clock and the paired inputs samples are provided at the half-rate clock and ensuing processing (not shown in FIG. 14) such as Digital Signal Processing, accumulation, and other arithmetic operations is performed at the half-rate clock.

In general, pipeline stages in the ensuing processing may follow as needed and they are at the half-rate clock.

In an example embodiment, the ensuing processing includes two half-rate accumulators of FIG. 12 in the half-rate DPLL design. With reference to FIG. 10, one may be in the integrator of the loop filter, and the other in the accumulator for the phase control calculation. The accumulator pair subtractor 810 is placed after the add/drop decision module 808 in order to calculate the phase control pairs y(k) and y(k+1) after the add/drop adjustment.

In high-speed logic circuits, the clock rate for digital arithmetic circuits is operated at the limit for arithmetic adders and multipliers. At this timing limit, the resultant gate count for a given arithmetic circuit is significantly raised by a small increase in the clock rate. In fact, near the speed limit of the library, the gate count is more influenced by small changes in clock rate than by small changes in the number of adders and multipliers. If the high-speed clock is halved at the expense of more than doubling the number of DSP operations (adders and multipliers) to maintain identical functionality, the overall area and power consumption is nevertheless reduced when the circuit is synthesized for high clock speeds.

While the half-rate implementations of the present disclosure involves more adder circuits than the prior art full-rate implementations, the halving of the clock provides benefits in terms of reducing gate counts in critical timing paths of the logic design, and in terms of reducing the need for high-speed high-drive digital logic library cells.

Generally, implementations of the present disclosure have been described with respect to SERDES devices for electrical lines used in data communications at any data rate. However, they can be used for NRZ (Non-Return to Zero) systems (2 level keying) as well as higher order PAM (Pulse Amplitude Modulation) systems (4 level keying) and QAM (Quadrature Amplitude Modulation) systems, as long as the signal is ultimately synchronized by a DPLL circuit.

Embodiments of the present disclosure can also be used for filtering and phase calculation operations in feed-forward timing circuits, including burst-mode circuits. Furthermore, embodiments of the present disclosure can also be used for optical systems. In comparison to a system for electrical signals, the ADC may be substituted for a simple on/off sampler sensing the presence or absence of light. The timing error detector employs a higher oversampling rate to determine where signal edges are located within the baud interval.

Where the feed forward or feedback timing control circuits apply loop filters and phase accumulators or other accumulators at high speed, embodiments of the present disclosure reduces the digital timing constraints while maintaining performance.

In an aspect, the present disclosure provides a non-transitory machine-readable medium storing statements and instructions for execution by a processor to execute a method for generating a pair of loop filter outputs in a DSP timing recovery circuit. The method comprises: receiving, in one clock cycle, a pair of consecutive samples of an error signal from a timing error detector of the DSP timing recovery circuit; generating an integrator path signal by applying a single loop filter integration to a sum of the pair of consecutive samples of the error signal; generating a first loop filter output of the pair of loop filter outputs as a function of the integrator path signal and a first sample of the pair of consecutive samples of the error signal; and generating a second loop filter output of the pair of loop filter outputs as a function of the integrator path signal and a second sample of the pair of consecutive samples of the error signal.

In an aspect, the present disclosure provides a non-transitory machine-readable medium storing statements and instructions for execution by a processor to execute a method for generating a pair of phase control signals in a DSP timing recovery circuit. The method comprises: receiving, in one clock cycle, a pair of consecutive loop filter outputs from a loop filter of the DSP timing recovery circuit; generating a first accumulator gain signal by applying a first accumulator gain to the first loop filter output of the pair of loop filter outputs; generating a second accumulator gain signal by applying a second accumulator gain to the second loop filter output of the pair of loop filter outputs; generating a first phase control signal by accumulating the sum of the first accumulator gain signal and the second accumulator gain signal; and generating a second phase control signal by subtracting the second accumulator gain signal from the first phase control signal.

In another aspect, the present disclosure provides a non-transitory machine-readable medium storing statements and instructions for execution by a processor to execute a method for generating a pair of phase control signals in a DSP timing recovery circuit. The method comprises: receiving, in one clock cycle, a pair of consecutive samples of an error signal from a timing error detector of the DSP timing recovery circuit; generating an integrator path signal by applying a single loop filter integration to a sum of the pair of consecutive samples of the error signal; generating a first loop filter output as a function of the integrator path signal and a first sample of the pair of consecutive samples of the error signal; generating a second loop filter output as a function of the integrator path signal and a second sample of the pair of consecutive samples of the error signal; generating a first accumulator gain signal by applying a first accumulator gain to the first loop filter output; generating a second accumulator gain signal by applying a second accumulator gain to the second loop filter output; generating a first phase control signal by accumulating the sum of the first accumulator gain signal and the second accumulator gain signal; and generating a second phase control signal by subtracting the second accumulator gain signal from the first phase control signal.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method for generating a pair of loop filter outputs in a digital signal processing (DSP) timing recovery circuit, the method comprising:
   receiving, in one clock cycle, a pair of consecutive samples of an error signal from a timing error detector of the DSP timing recovery circuit;
   generating a integrator path signal by applying a single loop filter integration to a sum of the pair of consecutive samples of the error signal;
   generating a first loop filter output of the pair of loop filter outputs as a function of the integrator path signal and a first sample of the pair of consecutive samples of the error signal; and
   generating a second loop filter output of the pair of loop filter outputs as a function of the integrator path signal and a second sample of the pair of consecutive samples of the error signal.

2. The method of claim 1, wherein generating the integrator path signal includes:
   generating a first integrator gain signal by applying a first integrator gain to the sum of the pair of consecutive samples of the error signal; and
   generating the integrator path signal by applying the single loop filter integration to the first integrator gain signal.

3. The method of claim 2, wherein generating the first loop filter output and the second loop filter output includes:
   generating a second integrator gain signal by applying a second integrator gain to the second sample of the pair of consecutive samples of the error signal;
   generating an intermediate loop filter signal by subtracting the second integrator gain signal from the integrator path signal;
   generating a first proportional gain signal by applying a first proportional gain to the first sample of the pair of consecutive samples of the error signal;
   generating a second proportional gain signal by applying a second proportional gain to the second sample of the pair of consecutive samples of the error signal;
generating the first loop filter output of the pair of loop filter outputs by summing the first proportional gain signal and the intermediate loop filter signal; and
   generating the second loop filter output of the pair of loop filter outputs by summing the second proportional gain signal and the integrator path signal.

4. The method of claim 1, further comprising:
   buffering an output of the timing error detector at a full-rate clock cycle; and
   generating the pair of consecutive samples of the error signal from the buffered output at a half-rate clock cycle.

5. The method of claim 4, further comprising:
   generating a serialized loop filter output at the full-rate clock cycle by serializing the first loop filter output and the second loop filter output;
   generating a phase control signal and/or an add/drop control signal by accumulating the serialized loop filter output.

6. A method for generating a pair of phase control signals in a digital signal processing (DSP) timing recovery circuit, the method comprising:
   receiving, in one clock cycle, a pair of consecutive loop filter outputs from a loop filter of the DSP timing recovery circuit;
   generating a first accumulator gain signal by applying a first accumulator gain to the first loop filter output of the pair of loop filter outputs;
   generating a second accumulator gain signal by applying a second accumulator gain to the second loop filter output of the pair of loop filter outputs;
   generating a first phase control signal by accumulating the sum of the first accumulator gain signal and the second accumulator gain signal; and
   generating a second phase control signal by subtracting the second accumulator gain signal from the first phase control signal.

7. The method of claim 6, further comprising:
   modifying the first phase control signal and the second phase control signal based on a threshold signal.

8. The method of claim 7, wherein modifying the first phase control signal and the second phase control signal based on the threshold signal includes:
   modifying the first phase control signal by subtracting the threshold signal from the first phase control signal when the first phase control signal is greater than the threshold signal or modifying the first phase control signal by adding the threshold signal to the first phase control signal when the first phase control signal is less than the inverse of the threshold signal; and
   modifying the second phase control signal by generating the second phase control signal based on the modified first phase control signal.

9. The method of claim 7, further comprising
   determining an add/drop control signal based on the first phase control signal and the threshold signal.

10. The method of claim 9, wherein the add/drop control signal corresponds to an add signal when the first phase control signal is greater than the threshold signal and to a drop signal when the first phase control signal is less than the inverse of the threshold signal.

11. A method for generating a pair of phase control signals in a digital signal processing (DSP) timing recovery circuit, the method comprising:
   receiving, in one clock cycle, a pair of consecutive samples of an error signal from a timing error detector of the DSP timing recovery circuit;
   generating a integrator path signal by applying a single loop filter integration to a sum of the pair of consecutive samples of the error signal;
   generating a first loop filter output as a function of the integrator path signal and a first sample of the pair of consecutive samples of the error signal;
   generating a second loop filter output as a function of the integrator path signal and a second sample of the pair of consecutive samples of the error signal;
   generating a first accumulator gain signal by applying a first accumulator gain to the first loop filter output;
   generating a second accumulator gain signal by applying a second accumulator gain to the second loop filter output;
   generating a first phase control signal by accumulating the sum of the first accumulator gain signal and the second accumulator gain signal; and
   generating a second phase control signal by subtracting the second accumulator gain signal from the first phase control signal.

12. The method of claim 11, wherein generating the integrator path signal includes:

generating a first integrator gain signal by applying a first integrator gain to the sum of the pair of consecutive samples of the error signal; and
generating the integrator path signal by applying the single loop filter integration to the first integrator gain signal.

13. The method of claim 12, wherein generating the first loop filter output and the second loop filter output includes:
generating a second integrator gain signal by applying a second integrator gain to the second sample of the pair of consecutive samples of the error signal;
generating an intermediate loop filter signal by subtracting the second integrator gain signal from the integrator path signal;
generating a first proportional gain signal by applying a first proportional gain to the first sample of the pair of consecutive samples of the error signal;
generating a second proportional gain signal by applying a second proportional gain to the second sample of the pair of consecutive samples of the error signal;
generating the first loop filter output of the pair of loop filter outputs by summing the first proportional gain signal and the intermediate loop filter signal; and
generating the second loop filter output of the pair of loop filter outputs by summing the second proportional gain signal and the integrator path signal.

14. The method of claim 11, further comprising:
buffering output of the timing error detector at a full-rate clock cycle; and
generating the pair of consecutive samples of the error signal from the buffered output at a half-rate clock cycle.

15. The method of claim 11, further comprising:
modifying the first phase control signal and the second phase control signal based on a threshold signal.

16. The method of claim 15, wherein modifying the first phase control signal and the second phase control signal based on the threshold signal includes:
modifying the first phase control signal by subtracting the threshold signal from the first phase control signal when the first phase control signal is greater than the threshold signal or modifying the first phase control signal by adding the threshold signal to the first phase control signal when the first phase control signal is less than the inverse of the threshold signal; and
modifying the second phase control signal by generating the second phase control signal based on the modified first phase control signal.

17. The method of claim 15, further comprising:
determining an add/drop control signal based on the first phase control signal and the threshold signal.

18. The method of claim 17, wherein the add/drop control signal corresponds to an add signal when the first phase control signal is greater than the threshold signal and to a drop signal when the first phase control signal is less than the inverse of the threshold signal.

19. A loop filter for generating a pair of loop filter outputs from a pair of consecutive samples of an error signal provided by a timing error detector of a digital signal processing (DSP) timing recovery circuit, the loop filter comprising:
a single loop filter integrator configured to generate an integrator path signal from a sum of the pair of consecutive samples of the error signal;
a first loop filter output generator configured to generate a first loop filter output of a pair of loop filter outputs as a function of the integrator path signal and a first sample of the pair of consecutive samples of the error signal; and
a second loop filter output generator configured to generate a second loop filter output of the pair of loop filter outputs as a function of the integrator path signal and a second sample of the pair of consecutive samples of the error signal.

20. The loop filter of claim 19, wherein the single loop filter integrator is further configured to:
generate a first integrator gain signal by applying a first integrator gain to the sum of the pair of consecutive samples of the error signal; and
generate the integrator path signal from the first integrator gain signal.

21. The loop filter of claim 20, wherein
the first loop filter output generator is further configured to:
generate a first proportional gain signal by applying a first proportional gain to the first sample of the pair of consecutive samples of the error signal; and
the second loop filter output generator is further configured to:
generate a second integrator gain signal by applying a second integrator gain to the second sample of the pair of consecutive samples of the error signal;
generate an intermediate loop filter signal by subtracting the second integrator gain signal from the integrator path signal; and
generate a second proportional gain signal by applying a second proportional gain to the second sample of the pair of consecutive samples of the error signal;
the first loop filter output generator being further configured to:
generate the first loop filter output of the pair of loop filter outputs by summing the first proportional gain signal and the intermediate loop filter signal; and
the second loop filter output generator being further configured to:
generate the second loop filter output of the pair of loop filter outputs by summing the second proportional gain signal and the integrator path signal.

22. The loop filter of claim 19, further comprising:
a pairing circuit configured to receive the error signal at a full-rate clock cycle and to generate a pair of consecutive loop filter outputs at a half-rate clock cycle.

23. The loop filter of claim 22, further comprising:
a serializer configured to generate a serialized loop filter output at the full-rate clock cycle by serializing the first loop filter output and the second loop filter output;
and an accumulator configured to generate a phase control signal and/or an add/drop control signal by accumulating the serialized loop filter output.

24. An accumulator for generating a pair of phase control signals in a digital signal processing (DSP) timing recovery circuit, the accumulator comprising:
an accumulator register and an accumulator pair subtractor;
the accumulator configured to:
receive, in one clock cycle, a pair of consecutive loop filter outputs from a loop filter of the DSP timing recovery circuit;
generate a first accumulator gain signal by applying a first accumulator gain to the first loop filter output of the pair of loop filter outputs;
generate a second accumulator gain signal by applying a second accumulator gain to the second loop filter output of the pair of loop filter outputs;
generate a first phase control signal by accumulating, using the accumulator register, the sum of the first accumulator gain signal and the second accumulator gain signal; and generate a second phase control signal by subtracting, using the accumulator pair subtractor, the second accumulator gain signal from the first phase control signal.

25. The accumulator of claim 24, further comprising:
a pairing circuit configured to receive loop filter output at a full-rate clock cycle and to generate a pair of consecutive loop filter outputs at a half-rate clock cycle.

26. The accumulator of claim 24, further comprising:
an add/drop decision module configured to modify the first phase control signal and the second phase control signal based on a threshold signal.

27. The accumulator of claim 26, wherein the add/drop decision module is further configured to:
modify the first phase control signal by subtracting the threshold signal from the first phase control signal when the first phase control signal is greater than the threshold signal,
or modify the first phase control signal by adding the threshold signal to the first phase control signal when the first phase control signal is less than the inverse of the threshold signal; and
modify the second phase control signal by generating the second phase control signal based on the modified first phase control signal.

28. The accumulator of claim 26, wherein the add/drop decision module is further configured to:
determine an add/drop control signal based on the first phase control signal and the threshold signal.

29. The accumulator of claim 28, wherein the add/drop control signal corresponds to an add signal when the first phase control signal is greater than the threshold signal and to a drop signal when the first phase control signal is less than the inverse of the threshold signal.

30. A phase control signal generator for generating a pair of phase control signals from a pair of consecutive samples of an error signal provided by a timing error detector of a digital signal processing (DSP) timing recovery circuit, the phase control signal generator comprising:
a single loop filter integrator configured to generate an integrator path signal from a sum of the pair of consecutive samples of the error signal;
a first loop filter output generator configured to generate a first loop filter output as a function of the integrator path signal and a first sample of the pair of consecutive samples of the error signal;
a second loop filter output generator configured to generate a second loop filter output as a function of the integrator path signal and a second sample of the pair of consecutive samples of the error signal; and
an accumulator configured to:
generate a first accumulator gain signal by applying a first accumulator gain to the first loop filter output;
generate a second accumulator gain signal by applying a second accumulator gain to the second loop filter output;
generate a first phase control signal by accumulating the sum of the first accumulator gain signal and the second accumulator gain signal; and
generate a second phase control signal by subtracting the second accumulator gain signal from the first phase control signal.

31. The phase control signal generator of claim 30, wherein the single loop filter integrator is further configured to:
generate a first integrator gain signal by applying a first integrator gain to the sum of the pair of consecutive samples of the error signal; and
generate the integrator path signal from the first integrator gain signal.

32. The phase control signal generator of claim 31, wherein the first loop filter output generator is further configured to:
generate a first proportional gain signal by applying a first proportional gain to the first sample of the pair of consecutive samples of the error signal; and
wherein the second loop filter output generator is further configured to:
generate a second integrator gain signal by applying a second integrator gain to the second sample of the pair of consecutive samples of the error signal;
generate an intermediate loop filter signal by subtracting the second integrator gain signal from the integrator path signal;
generate a second proportional gain signal by applying a second proportional gain to the second sample of the pair of consecutive samples of the error signal;
the first loop filter output generator being further configured to:
generate the first loop filter output of the pair of loop filter outputs by summing the first proportional gain signal and the intermediate loop filter signal; and
the second loop filter output generator being further configured to:
generate the second loop filter output of the pair of loop filter outputs by summing the second proportional gain signal and the integrator path signal.

33. The phase control signal generator of claim 30, further comprising:
a pairing circuit configured to receive the error signal at a full-rate clock cycle and to generate a pair of consecutive loop filter outputs at a half-rate clock cycle.

34. The phase control signal generator of claim 30, further comprising:
an add/drop decision module configured to modify the first phase control signal and the second phase control signal based on a threshold signal.

35. The phase control signal generator of claim 34, wherein the add/drop decision module is further configured to:
modify the first phase control signal by subtracting the threshold signal from the first phase control signal when the first phase control signal is greater than the threshold signal or modify the first phase control signal by adding the threshold signal to the first phase control signal when the first phase control signal is less than the inverse of the threshold signal; and
modify the second phase control signal by generating the second phase control signal based on the updated first phase control signal.

36. The phase control signal generator of claim 35, wherein the add/drop decision module is further configured to:
determine an add/drop control signal based on the first phase control signal and the threshold signal.

37. The phase control signal generator of claim 36, wherein the add/drop control signal corresponds to an add signal when the first phase control signal is greater than the threshold signal and to a drop signal when the first phase control signal is less than the inverse of the threshold signal.

38. A non-transitory machine-readable medium storing statements and instructions for execution by a processor to execute a method for generating a pair of loop filter outputs in a digital signal processing (DSP) timing recovery circuit, the method comprising:
receiving, in one clock cycle, a pair of consecutive samples of an error signal from a timing error detector of the DSP timing recovery circuit;

generating an integrator path signal by applying a single loop filter integration to a sum of the pair of consecutive samples of the error signal;

generating a first loop filter output of the pair of loop filter outputs as a function of the integrator path signal and a first sample of the pair of consecutive samples of the error signal; and generating a second loop filter output of the pair of loop filter outputs as a function of the integrator path signal and a second sample of the pair of consecutive samples of the error signal.

39. A non-transitory machine-readable medium storing statements and instructions for execution by a processor to execute a method for generating a pair of phase control signals in a digital signal processing (DSP) timing recovery circuit, the method comprising:

receiving, in one clock cycle, a pair of consecutive loop filter outputs from a loop filter of the DSP timing recovery circuit;

generating a first accumulator gain signal by applying a first accumulator gain to the first loop filter output of the pair of loop filter outputs;

generating a second accumulator gain signal by applying a second accumulator gain to the second loop filter output of the pair of loop filter outputs;

generating a first phase control signal by accumulating the sum of the first accumulator gain signal and the second accumulator gain signal; and generating a second phase control signal by subtracting the second accumulator gain signal from the first phase control signal.

40. A non-transitory machine-readable medium storing statements and instructions for execution by a processor to execute a method for generating a pair of phase control signals in a digital signal processing (DSP) timing recovery circuit, the method comprising:

receiving, in one clock cycle, a pair of consecutive samples of an error signal from a timing error detector of the DSP timing recovery circuit;

generating an integrator path signal by applying a single loop filter integration to a sum of the pair of consecutive samples of the error signal;

generating a first loop filter output as a function of the integrator path signal and a first sample of the pair of consecutive samples of the error signal;

generating a second loop filter output as a function of the integrator path signal and a second sample of the pair of consecutive samples of the error signal;

generating a first accumulator gain signal by applying a first accumulator gain to the first loop filter output;

generating a second accumulator gain signal by applying a second accumulator gain to the second loop filter output;

generating a first phase control signal by accumulating the sum of the first accumulator gain signal and the second accumulator gain signal; and generating a second phase control signal by subtracting the second accumulator gain signal from the first phase control signal.

* * * * *